US011674375B2

(12) United States Patent
Yu et al.

(10) Patent No.: US 11,674,375 B2
(45) Date of Patent: Jun. 13, 2023

(54) FIELD OPERATIONS SYSTEM WITH FILTER

(71) Applicant: Schlumberger Technology Corporation, Sugar Land, TX (US)

(72) Inventors: Yingwei Yu, Katy, TX (US); Qiuhua Liu, Sugar Land, TX (US); Richard John Meehan, Houston, TX (US); Sylvain Chambon, Katy, TX (US); Mohammad Khairi Hamzah, Katy, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 503 days.

(21) Appl. No.: 16/636,317

(22) PCT Filed: Nov. 15, 2018

(86) PCT No.: PCT/US2018/061314
§ 371 (c)(1),
(2) Date: Feb. 3, 2020

(87) PCT Pub. No.: WO2019/099693
PCT Pub. Date: May 23, 2019

(65) Prior Publication Data
US 2021/0166115 A1 Jun. 3, 2021

Related U.S. Application Data

(60) Provisional application No. 62/586,288, filed on Nov. 15, 2017.

(51) Int. Cl.
*E21B 44/00* (2006.01)
*E21B 21/08* (2006.01)
(Continued)

(52) U.S. Cl.
CPC .............. *E21B 44/00* (2013.01); *E21B 21/08* (2013.01); *E21B 49/003* (2013.01); *G01V 1/50* (2013.01);
(Continued)

(58) Field of Classification Search
CPC .......... E21B 44/00; G06F 30/20; G06F 30/27; G06F 17/15; G06F 17/16; G06N 3/08; G06N 3/0445
(Continued)

(56) References Cited

U.S. PATENT DOCUMENTS 6,526,167 B1 2/2003 Numaoka
7,128,167 B2 * 10/2006 Dunlop ................... E21B 44/00
175/45
(Continued)

FOREIGN PATENT DOCUMENTS

CN 103606006 A 2/2014
CN 106919977 7/2017
(Continued)

OTHER PUBLICATIONS

Haugen et al. (History Matching Using the Ensemble Kalman Filter on a North Sea Field Case,2008, Society of Petroleum Engineers, pp. 382-391) (Year: 2008).*
(Continued)

Primary Examiner — Iftekhar A Khan
(74) Attorney, Agent, or Firm — Aashish Chawla

(57) ABSTRACT

A method can include training a deep neural network to generate a trained deep neural network where the trained deep neural network represents functions of a nonlinear Kalman filter that represents a dynamic system of equipment and environment via an internal state vector of the dynamic system; generating a base internal state vector, that corresponds to a pre-defined operational procedure, using the (Continued)

trained deep neural network; receiving operation data from the equipment responsive to operation in the environment; generating an internal state vector using the operation data and the trained deep neural network; and comparing at least the internal state vector to at least the base internal state vector.

19 Claims, 23 Drawing Sheets

(51) Int. Cl.
```
G06N 7/00      (2023.01)
G01V 1/50      (2006.01)
E21B 49/00     (2006.01)
G01V 11/00     (2006.01)
G06F 30/20     (2020.01)
G06F 17/15     (2006.01)
G06F 17/16     (2006.01)
G06F 30/27     (2020.01)
G06N 3/044     (2023.01)
G06N 3/047     (2023.01)
G06N 3/08      (2023.01)
G06T 13/80     (2011.01)
```
(52) U.S. Cl.
CPC .............. *G01V 11/00* (2013.01); *G06F 17/15* (2013.01); *G06F 17/16* (2013.01); *G06F 30/20* (2020.01); *G06F 30/27* (2020.01); *G06N 3/044* (2023.01); *G06N 3/047* (2023.01); *G06N 3/08* (2013.01); *G06N 7/00* (2013.01); *G01V 2200/14* (2013.01); *G01V 2200/16* (2013.01); *G06T 13/80* (2013.01)

(58) Field of Classification Search
USPC .......................................................... 706/15
See application file for complete search history.

(56) References Cited

U.S. PATENT DOCUMENTS

| | | | |
|---|---|---|---|
| 7,321,882 B2* | 1/2008 | Jaeger | G06N 3/08 706/30 |
| 8,504,361 B2* | 8/2013 | Collobert | G06F 40/284 704/9 |
| 10,066,473 B2* | 9/2018 | Khare | E21B 44/00 |
| 10,400,573 B2* | 9/2019 | Yang | E21B 7/06 |
| 11,474,486 B2* | 10/2022 | Berntorp | G06N 7/01 |
| 2004/0117043 A1 | 6/2004 | Touzov | |
| 2004/0124009 A1* | 7/2004 | Hoteit | G06N 7/01 175/48 |
| 2004/0124012 A1* | 7/2004 | Dunlop | E21B 44/00 175/57 |
| 2004/0223480 A1* | 11/2004 | Nguyen | H04L 25/0236 370/342 |
| 2004/0256152 A1 | 12/2004 | Dashevskiy et al. | |
| 2006/0047607 A1 | 3/2006 | Boydon et al. | |
| 2006/0221081 A1 | 10/2006 | Cohen et al. | |
| 2007/0022068 A1* | 1/2007 | Linsker | G05B 13/026 706/23 |
| 2007/0118346 A1* | 5/2007 | Wen | E21B 49/00 703/10 |
| 2007/0185696 A1* | 8/2007 | Moran | G05B 13/027 703/10 |
| 2010/0302129 A1 | 12/2010 | Kastrup | |
| 2012/0123757 A1 | 5/2012 | Ertas et al. | |
| 2013/0013543 A1 | 1/2013 | Dull et al. | |
| 2013/0282635 A1* | 10/2013 | Dull | G06N 3/044 706/25 |
| 2015/0308204 A1 | 10/2015 | Johnson et al. | |
| 2016/0099010 A1* | 4/2016 | Sainath | G10L 15/16 704/232 |
| 2016/0231716 A1* | 8/2016 | Johnson | G05B 13/041 |
| 2018/0052078 A1 | 2/2018 | Newberger | |
| 2018/0188403 A1 | 7/2018 | Halsey et al. | |
| 2019/0034558 A1* | 1/2019 | Leeman-Munk | G06F 16/904 |
| 2019/0065961 A1* | 2/2019 | Szu | G06N 3/042 |
| 2019/0145239 A1* | 5/2019 | Yu | E21B 44/00 175/40 |
| 2019/0147125 A1 | 5/2019 | Yu et al. | |
| 2019/0180882 A1* | 6/2019 | Han | G06N 3/08 |
| 2020/0104437 A1* | 4/2020 | Yu | G01M 5/0083 |
| 2021/0148213 A1* | 5/2021 | Madasu | G06F 18/214 |
| 2021/0166115 A1* | 6/2021 | Yu | E21B 44/00 |
| 2022/0013239 A1 | 1/2022 | Iwamori et al. | |
| 2022/0187253 A1 | 6/2022 | Takamine et al. | |

FOREIGN PATENT DOCUMENTS

| | | |
|---|---|---|
| CN | 108363361 | 8/2018 |
| JP | 2011123187 | 8/2011 |

OTHER PUBLICATIONS

Dan Simon (Using Nonlinear Kalman Filtering to Estimate Signals, 2013, pp. 1-16) (Year: 2013).*
Sahika Genc (Parametric System Identification Using Deep Convolutional Neural Networks, IEEE, 2017, pp. 2112-2119) (Year: 2017).*
Del Moral, "Nonlinear Filtering: Interacting Particle Solution," Markov Processes and Related Fields. 2 (4), 1996, pp. 555-580.
Deng, et al., "ImageNet: A large-scale hierarchical image database," In Proc. CVPR, 2009.
Gers, et al., "Learning to Forget: Continual Prediction with LSTM," Journal of Neural Computation, vol. 12, Issue 10, Oct. 2000, pp. 2451-2471.
Goodfellow, et al., "Deep Learning," MIT Press book, 2016.
Hochreiter, et al., "Long Short-Term Memory," Neural Computation 9(8), pp. 1735-1780, 1997.
Krishnan, et al., "Deep Kalman Filters," submitted on Nov. 16, 2015, Courant Institute of Mathematical Sciences, New York University, retrieved at https://arxiv.org/abs/1511.05121.
Pearson, "On Lines and Planes of Closest Fit to Systems of Points in Space," Philosophical Magazine 2: 1901, pp. 559-572.
Rosenblatt, "Principles of neurodynamics: Perceptrons and the Theory of Brain Mechanisms," Spartan Books, Washington DC, 1961.
Shashua et al., "Deep Robust Kalman Filter", submitted on Mar. 7, 2017, retrieved at https://arxiv.org/pdf/1703.02310.pdf.
Silver, et al, "Mastering the Game of Go with Deep Neural Networks and Tree Search," Nature, vol. 529, Jan. 28, 2016, pp. 484-489.
Simonyan, et al., "Very Deep Convolutional Networks for Large-Scale Image Recognition," Conference paper at International Conference on Learning Representations 2015.
Thrun, "Particle Filters in Robotics," UAI 2002 Proceedings of the Eighteenth conference on Uncertainty in artificial intelligence, 2002, pp. 511-518.
Van den Oord, "WaveNet: A Generative Model For Raw Audio," introduced at WaveNet, a deep neural network for generating raw audio waveforms, 2016.
Yu, et al., "Recorded Well Data Enriches the Testing of Automation Systems by Using a Deep Neural Network Approach," IADC/SPE-189591-MS, IADC/SPE Drilling Conference and Exhibition held in Fort Worth, TX, Mar. 6-8, 2018.
International Search Report and Written Opinion for the counterpart International patent application PCT/US2018/061314 dated Feb. 1, 2019.
Stubberud S. C. et al., "System identification using the neural-extended Kalman filter for state-estimation and controller modification", Neural networks, 2008, pp. 1352-1357.
De Lima, D. P. et al., "neural Network Training Using Unscented and Extended Kalman Filter", Robotics Automation Engineering Journal, 2017, 1(4), 6 pages.

(56) References Cited

OTHER PUBLICATIONS

Yu, Y. et al., "Using Deep Kalman Filter to Predict Drilling Time Series", IPTC-19207-MS, 2019, pp. 1-11.
Stubberud S. C. et al., "System Identification Using the Neural-Extended Kalman Filter for State-Estimation and Controller Modification", 2008 International Joint Conference on Neural Networks, 2008, pp. 1352-1357.

* cited by examiner

System 1010

System 1030

System 1050

Comparison 1400

Determine an operation sequence $OP_i$, the score of the following OP (per $OP_s$) is evaluated with a function $C$ (e.g., a distance function):

$S = C(OP_s, OP_i)$

Training Data 1810

Training Data 1830

FIELD OPERATIONS SYSTEM WITH FILTER

RELATED APPLICATIONS

This application claims priority to and the benefit of a U.S. Provisional Application having Ser. No. 62/586,288, filed 15 Nov. 2017, which is incorporated by reference herein, and this application incorporates by reference herein U.S. Non-Provisional Application having Ser. No. 16/192, 584, filed 15 Nov. 2018, entitled "Field Operations System", and incorporates by reference herein U.S. Non-Provisional Application having Ser. No. 16/192,609, filed 15 Nov. 2018, entitled "Field Operations System with Particle Filter".

BACKGROUND

A resource field can be an accumulation, pool or group of pools of one or more resources (e.g., oil, gas, oil and gas) in a subsurface environment. A resource field can include at least one reservoir. A reservoir may be shaped in a manner that can trap hydrocarbons and may be covered by an impermeable or sealing rock. A bore can be drilled into an environment where the bore may be utilized to form a well that can be utilized in producing hydrocarbons from a reservoir.

A rig can be a system of components that can be operated to form a bore in an environment, to transport equipment into and out of a bore in an environment, etc. As an example, a rig can include a system that can be used to drill a bore and to acquire information about an environment, about drilling, etc. A resource field may be an onshore field, an offshore field or an on- and offshore field. A rig can include components for performing operations onshore and/or offshore. A rig may be, for example, vessel-based, offshore platform-based, onshore, etc.

Field planning can occur over one or more phases, which can include an exploration phase that aims to identify and assess an environment (e.g., a prospect, a play, etc.), which may include drilling of one or more bores (e.g., one or more exploratory wells, etc.). Other phases can include appraisal, development and production phases.

SUMMARY

A method can include training a deep neural network to generate a trained deep neural network where the trained deep neural network represents functions of a non-linear Kalman filter that represents a dynamic system of equipment and environment via an internal state vector of the dynamic system; generating a base internal state vector, that corresponds to a pre-defined operational procedure, using the trained deep neural network; receiving operation data from the equipment responsive to operation in the environment; generating an internal state vector using the operation data and the trained deep neural network; and comparing at least the internal state vector to at least the base internal state vector. A system can include a processor; memory accessible by the processor; processor-executable instructions stored in the memory and executable to instruct the system to: train a deep neural network to generate a trained deep neural network where the trained deep neural network represents functions of a non-linear Kalman filter that represents a dynamic system of equipment and environment via an internal state vector of the dynamic system; generate a base internal state vector, that corresponds to a pre-defined operational procedure, using the trained deep neural network; receive operation data from the equipment responsive to operation in the environment; generate an internal state vector using the operation data and the trained deep neural network; and compare at least the internal state vector to at least the base internal state vector. One or more computer-readable storage media can include processor-executable instructions to instruct a computing system to: train a deep neural network to generate a trained deep neural network where the trained deep neural network represents functions of a non-linear Kalman filter that represents a dynamic system of equipment and environment via an internal state vector of the dynamic system; generate a base internal state vector, that corresponds to a pre-defined operational procedure, using the trained deep neural network; receive operation data from the equipment responsive to operation in the environment; generate an internal state vector using the operation data and the trained deep neural network; and compare at least the internal state vector to at least the base internal state vector. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Figure 1:
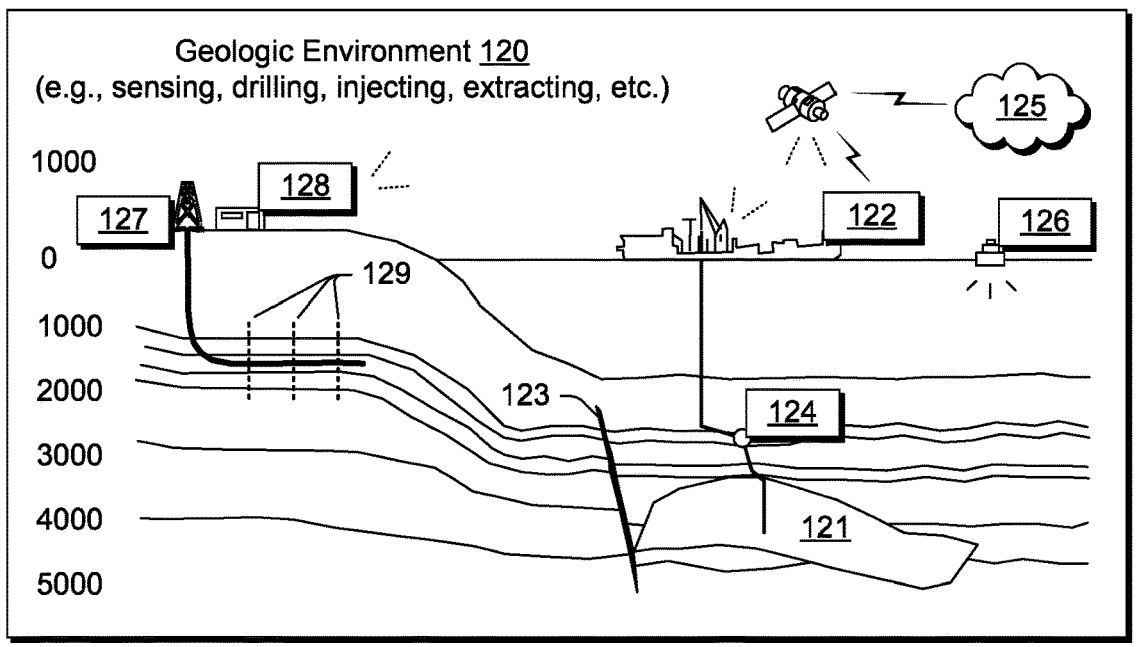
FIG. 1 illustrates examples of equipment in a geologic environment.
Figure 1:
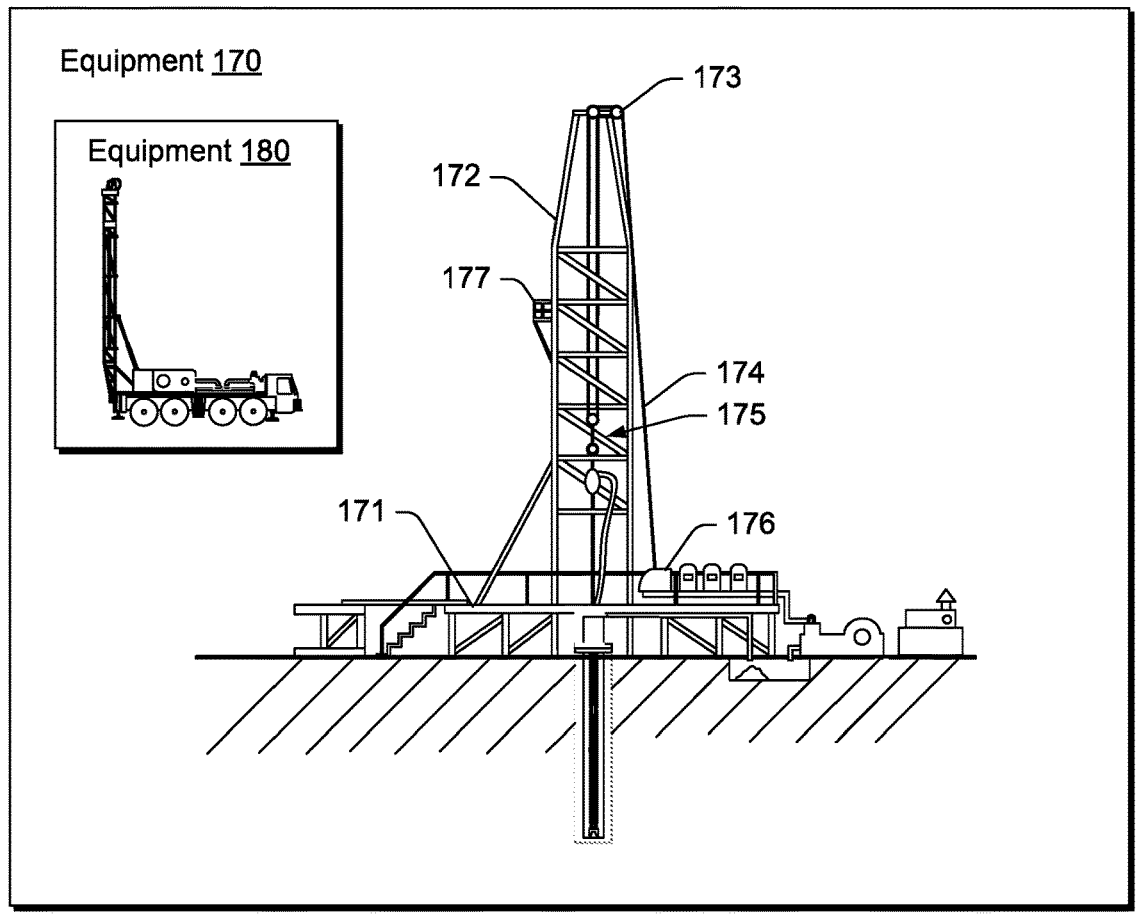

FIG. 1 shows an example of a geologic environment 120. In FIG. 1, the geologic environment 120 may be a sedimentary basin that includes layers (e.g., stratification) that include a reservoir 121 and that may be, for example, intersected by a fault 123 (e.g., or faults). As an example, the geologic environment 120 may be outfitted with any of a variety of sensors, detectors, actuators, etc. For example, equipment 122 may include communication circuitry to receive and to transmit information with respect to one or more networks 125. Such information may include information associated with downhole equipment 124, which may be equipment to acquire information, to assist with resource recovery, etc. Other equipment 126 may be located remote from a well site and include sensing, detecting, emitting or other circuitry. Such equipment may include storage and communication circuitry to store and to communicate data, instructions, etc. As an example, one or more pieces of equipment may provide for measurement, collection, communication, storage, analysis, etc. of data (e.g., for one or more produced resources, etc.). As an example, one or more satellites may be provided for purposes of communications, data acquisition, etc. For example, FIG. 1 shows a satellite in communication with the network 125 that may be configured for communications, noting that the satellite may additionally or alternatively include circuitry for imagery (e.g., spatial, spectral, temporal, radiometric, etc.).

FIG. 1 also shows the geologic environment 120 as optionally including equipment 127 and 128 associated with a well that includes a substantially horizontal portion that may intersect with one or more fractures 129. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop the reservoir (e.g., via fracturing, injecting, extracting, etc.). As an example, the equipment 127 and/or 128 may include components, a system, systems, etc. for fracturing, seismic sensing, analysis of seismic data, assessment of one or more fractures, injection, production, etc. As an example, the equipment 127 and/or 128 may provide for measurement, collection, communication, storage, analysis, etc. of data such as, for example, production data (e.g., for one or more produced resources). As an example, one or more satellites may be provided for purposes of communications, data acquisition, etc.

FIG. 1 also shows an example of equipment 170 and an example of equipment 180. Such equipment, which may be systems of components, may be suitable for use in the geologic environment 120. While the equipment 170 and 180 are illustrated as land-based, various components may be suitable for use in an offshore system.

The equipment 170 includes a platform 171, a derrick 172, a crown block 173, a line 174, a traveling block assembly 175, drawworks 176 and a landing 177 (e.g., a monkeyboard). As an example, the line 174 may be controlled at least in part via the drawworks 176 such that the traveling block assembly 175 travels in a vertical direction with respect to the platform 171. For example, by drawing the line 174 in, the drawworks 176 may cause the line 174 to run through the crown block 173 and lift the traveling block assembly 175 skyward away from the platform 171; whereas, by allowing the line 174 out, the drawworks 176 may cause the line 174 to run through the crown block 173 and lower the traveling block assembly 175 toward the platform 171. Where the traveling block assembly 175 carries pipe (e.g., casing, etc.), tracking of movement of the traveling block 175 may provide an indication as to how much pipe has been deployed.

A derrick can be a structure used to support a crown block and a traveling block operatively coupled to the crown block at least in part via line. A derrick may be pyramidal in shape and offer a suitable strength-to-weight ratio. A derrick may be movable as a unit or in a piece by piece manner (e.g., to be assembled and disassembled).

As an example, drawworks may include a spool, brakes, a power source and assorted auxiliary devices. Drawworks may controllably reel out and reel in line. Line may be reeled over a crown block and coupled to a traveling block to gain mechanical advantage in a "block and tackle" or "pulley" fashion. Reeling out and in of line can cause a traveling block (e.g., and whatever may be hanging underneath it), to be lowered into or raised out of a bore. Reeling out of line may be powered by gravity and reeling in by a motor, an engine, etc. (e.g., an electric motor, a diesel engine, etc.).

As an example, a crown block can include a set of pulleys (e.g., sheaves) that can be located at or near a top of a derrick or a mast, over which line is threaded. A traveling block can include a set of sheaves that can be moved up and down in a derrick or a mast via line threaded in the set of sheaves of the traveling block and in the set of sheaves of a crown block. A crown block, a traveling block and a line can form a pulley system of a derrick or a mast, which may enable handling of heavy loads (e.g., drillstring, pipe, casing, liners, etc.) to be lifted out of or lowered into a bore. As an example, line may be about a centimeter to about five centimeters in diameter as, for example, steel cable. Through use of a set of sheaves, such line may carry loads heavier than the line could support as a single strand.

As an example, a derrickman may be a rig crew member that works on a platform attached to a derrick or a mast. A derrick can include a landing on which a derrickman may stand. As an example, such a landing may be about 10 meters or more above a rig floor. In an operation referred to as trip out of the hole (TOH), a derrickman may wear a safety harness that enables leaning out from the work landing (e.g., monkeyboard) to reach pipe in located at or near the center of a derrick or a mast and to throw a line around the pipe and pull it back into its storage location (e.g., fingerboards), for example, until it a time at which it may be desirable to run the pipe back into the bore. As an example, a rig may include automated pipe-handling equipment such that the derrickman controls the machinery rather than physically handling the pipe.

As an example, a trip may refer to the act of pulling equipment from a bore and/or placing equipment in a bore. As an example, equipment may include a drillstring that can be pulled out of a hole and/or placed or replaced in a hole. As an example, a pipe trip may be performed where a drill bit has dulled or has otherwise ceased to drill efficiently and is to be replaced.

Figure 2:
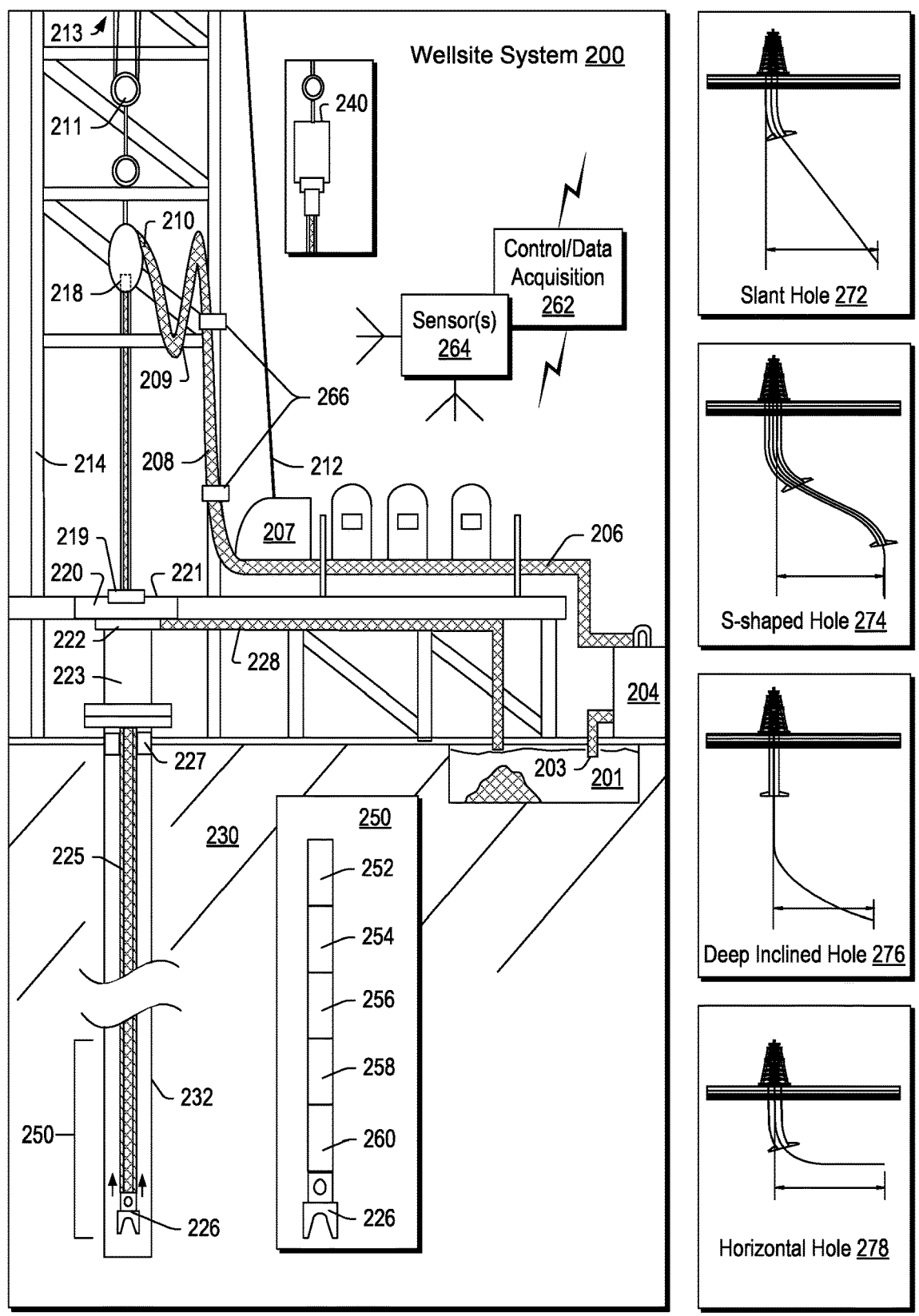
FIG. 2 illustrates examples of equipment and examples of hole types.

FIG. 2 shows an example of a wellsite system 200 (e.g., at a wellsite that may be onshore or offshore). As shown, the wellsite system 200 can include a mud tank 201 for holding mud and other material (e.g., where mud can be a drilling fluid), a suction line 203 that serves as an inlet to a mud pump 204 for pumping mud from the mud tank 201 such that mud flows to a vibrating hose 206, a drawworks 207 for winching drill line or drill lines 212, a standpipe 208 that receives mud from the vibrating hose 206, a kelly hose 209 that receives mud from the standpipe 208, a gooseneck or goosenecks 210, a traveling block 211, a crown block 213 for carrying the traveling block 211 via the drill line or drill lines 212 (see, e.g., the crown block 173 of FIG. 1), a derrick 214 (see, e.g., the derrick 172 of FIG. 1), a kelly 218 or a top drive 240, a kelly drive bushing 219, a rotary table 220, a drill floor 221, a bell nipple 222, one or more blowout preventors (BOPs) 223, a drillstring 225, a drill bit 226, a casing head 227 and a flow pipe 228 that carries mud and other material to, for example, the mud tank 201.

In the example system of FIG. 2, a borehole 232 is formed in subsurface formations 230 by rotary drilling; noting that various example embodiments may also use directional drilling.

As shown in the example of FIG. 2, the drillstring 225 is suspended within the borehole 232 and has a drillstring assembly 250 that includes the drill bit 226 at its lower end. As an example, the drillstring assembly 250 may be a bottom hole assembly (BHA).

The wellsite system 200 can provide for operation of the drillstring 225 and other operations. As shown, the wellsite system 200 includes the platform 211 and the derrick 214 positioned over the borehole 232. As mentioned, the wellsite system 200 can include the rotary table 220 where the drillstring 225 pass through an opening in the rotary table 220.

As shown in the example of FIG. 2, the wellsite system 200 can include the kelly 218 and associated components, etc., or a top drive 240 and associated components. As to a kelly example, the kelly 218 may be a square or hexagonal metal/alloy bar with a hole drilled therein that serves as a mud flow path. The kelly 218 can be used to transmit rotary motion from the rotary table 220 via the kelly drive bushing 219 to the drillstring 225, while allowing the drillstring 225 to be lowered or raised during rotation. The kelly 218 can pass through the kelly drive bushing 219, which can be driven by the rotary table 220. As an example, the rotary table 220 can include a master bushing that operatively couples to the kelly drive bushing 219 such that rotation of the rotary table 220 can turn the kelly drive bushing 219 and hence the kelly 218. The kelly drive bushing 219 can include an inside profile matching an outside profile (e.g., square, hexagonal, etc.) of the kelly 218; however, with slightly larger dimensions so that the kelly 218 can freely move up and down inside the kelly drive bushing 219.

As to a top drive example, the top drive 240 can provide functions performed by a kelly and a rotary table. The top drive 240 can turn the drillstring 225. As an example, the top drive 240 can include one or more motors (e.g., electric and/or hydraulic) connected with appropriate gearing to a short section of pipe called a quill, that in turn may be screwed into a saver sub or the drillstring 225 itself. The top drive 240 can be suspended from the traveling block 211, so the rotary mechanism is free to travel up and down the derrick 214. As an example, a top drive 240 may allow for drilling to be performed with more joint stands than a kelly/rotary table approach.

In the example of FIG. 2, the mud tank 201 can hold mud, which can be one or more types of drilling fluids. As an example, a wellbore may be drilled to produce fluid, inject fluid or both (e.g., hydrocarbons, minerals, water, etc.).

In the example of FIG. 2, the drillstring 225 (e.g., including one or more downhole tools) may be composed of a series of pipes threadably connected together to form a long tube with the drill bit 226 at the lower end thereof. As the drillstring 225 is advanced into a wellbore for drilling, at some point in time prior to or coincident with drilling, the mud may be pumped by the pump 204 from the mud tank 201 (e.g., or other source) via a the lines 206, 208 and 209 to a port of the kelly 218 or, for example, to a port of the top drive 240. The mud can then flow via a passage (e.g., or passages) in the drillstring 225 and out of ports located on the drill bit 226 (see, e.g., a directional arrow). As the mud exits the drillstring 225 via ports in the drill bit 226, it can then circulate upwardly through an annular region between an outer surface(s) of the drillstring 225 and surrounding wall(s) (e.g., open borehole, casing, etc.), as indicated by directional arrows. In such a manner, the mud lubricates the drill bit 226 and carries heat energy (e.g., frictional or other energy) and formation cuttings to the surface where the mud (e.g., and cuttings) may be returned to the mud tank 201, for example, for recirculation (e.g., with processing to remove cuttings, etc.).

The mud pumped by the pump 204 into the drillstring 225 may, after exiting the drillstring 225, form a mudcake that lines the wellbore which, among other functions, may reduce friction between the drillstring 225 and surrounding wall(s) (e.g., borehole, casing, etc.). A reduction in friction may facilitate advancing or retracting the drillstring 225. During a drilling operation, the entire drill string 225 may be pulled from a wellbore and optionally replaced, for example, with a new or sharpened drill bit, a smaller diameter drill string, etc. As mentioned, the act of pulling a drill string out of a hole or replacing it in a hole is referred to as tripping. A trip may be referred to as an upward trip or an outward trip or as a downward trip or an inward trip depending on trip direction.

As an example, consider a downward trip where upon arrival of the drill bit 226 of the drill string 225 at a bottom of a wellbore, pumping of the mud commences to lubricate the drill bit 226 for purposes of drilling to enlarge the wellbore. As mentioned, the mud can be pumped by the pump 204 into a passage of the drillstring 225 and, upon filling of the passage, the mud may be used as a transmission medium to transmit energy, for example, energy that may encode information as in mud-pulse telemetry.

As an example, mud-pulse telemetry equipment may include a downhole device configured to effect changes in pressure in the mud to create an acoustic wave or waves upon which information may modulated. In such an example, information from downhole equipment (e.g., one or more modules of the drillstring 225) may be transmitted uphole to an uphole device, which may relay such information to other equipment for processing, control, etc.

As an example, telemetry equipment may operate via transmission of energy via the drillstring 225 itself. For example, consider a signal generator that imparts coded energy signals to the drillstring 225 and repeaters that may receive such energy and repeat it to further transmit the coded energy signals (e.g., information, etc.).

As an example, the drillstring 225 may be fitted with telemetry equipment 252 that includes a rotatable drive shaft, a turbine impeller mechanically coupled to the drive shaft such that the mud can cause the turbine impeller to rotate, a modulator rotor mechanically coupled to the drive shaft such that rotation of the turbine impeller causes said modulator rotor to rotate, a modulator stator mounted adjacent to or proximate to the modulator rotor such that rotation of the modulator rotor relative to the modulator stator creates pressure pulses in the mud, and a controllable brake for selectively braking rotation of the modulator rotor to modulate pressure pulses. In such example, an alternator may be coupled to the aforementioned drive shaft where the alternator includes at least one stator winding electrically coupled to a control circuit to selectively short the at least one stator winding to electromagnetically brake the alternator and thereby selectively brake rotation of the modulator rotor to modulate the pressure pulses in the mud.

In the example of FIG. 2, an uphole control and/or data acquisition system 262 may include circuitry to sense pressure pulses generated by telemetry equipment 252 and, for example, communicate sensed pressure pulses or information derived therefrom for process, control, etc.

The assembly 250 of the illustrated example includes a logging-while-drilling (LWD) module 254, a measuring-while-drilling (MWD) module 256, an optional module 258, a roto-steerable system and motor 260, and the drill bit 226. Such components or modules may be referred to as tools where a drillstring can include a plurality of tools.

The LWD module 254 may be housed in a suitable type of drill collar and can contain one or a plurality of selected types of logging tools. It will also be understood that more than one LWD and/or MWD module can be employed, for example, as represented at by the module 256 of the drillstring assembly 250. Where the position of an LWD module is mentioned, as an example, it may refer to a module at the position of the LWD module 254, the module 256, etc. An LWD module can include capabilities for measuring, processing, and storing information, as well as for communicating with the surface equipment. In the illustrated example, the LWD module 254 may include a seismic measuring device.

The MWD module 256 may be housed in a suitable type of drill collar and can contain one or more devices for measuring characteristics of the drillstring 225 and the drill bit 226. As an example, the MWD tool 254 may include equipment for generating electrical power, for example, to power various components of the drillstring 225. As an example, the MWD tool 254 may include the telemetry equipment 252, for example, where the turbine impeller can generate power by flow of the mud; it being understood that other power and/or battery systems may be employed for purposes of powering various components. As an example, the MWD module 256 may include one or more of the following types of measuring devices: a weight-on-bit measuring device, a torque measuring device, a vibration measuring device, a shock measuring device, a stick slip measuring device, a direction measuring device, and an inclination measuring device.

FIG. 2 also shows some examples of types of holes that may be drilled. For example, consider a slant hole 272, an S-shaped hole 274, a deep inclined hole 276 and a horizontal hole 278.

As an example, a drilling operation can include directional drilling where, for example, at least a portion of a well includes a curved axis. For example, consider a radius that defines curvature where an inclination with regard to the vertical may vary until reaching an angle between about 30 degrees and about 60 degrees or, for example, an angle to about 90 degrees or possibly greater than about 90 degrees.

As an example, a directional well can include several shapes where each of the shapes may aim to meet particular operational demands. As an example, a drilling process may be performed on the basis of information as and when it is relayed to a drilling engineer. As an example, inclination and/or direction may be modified based on information received during a drilling process.

As an example, deviation of a bore may be accomplished in part by use of a downhole motor and/or a turbine. As to a motor, for example, a drillstring can include a positive displacement motor (PDM).

As an example, a system may be a steerable system and include equipment to perform a method such as geosteering. As an example, a steerable system can include a PDM or a turbine on a lower part of a drillstring which, just above a drill bit, a bent sub can be mounted. As an example, above a PDM, MWD equipment that provides real time or near real time data of interest (e.g., inclination, direction, pressure, temperature, real weight on the drill bit, torque stress, etc.) and/or LWD equipment may be installed. As to the latter, LWD equipment can make it possible to send to the surface various types of data of interest, including for example, geological data (e.g., gamma ray log, resistivity, density and sonic logs, etc.).

The coupling of sensors providing information on the course of a well trajectory, in real time or near real time, with, for example, one or more logs characterizing the formations from a geological viewpoint, can allow for implementing a geosteering method. Such a method can include navigating a subsurface environment, for example, to follow a desired route to reach a desired target or targets.

As an example, a drillstring can include an azimuthal density neutron (ADN) tool for measuring density and porosity; a MWD tool for measuring inclination, azimuth and shocks; a compensated dual resistivity (CDR) tool for measuring resistivity and gamma ray related phenomena; one or more variable gauge stabilizers; one or more bend joints; and a geosteering tool, which may include a motor and optionally equipment for measuring and/or responding to one or more of inclination, resistivity and gamma ray related phenomena.

As an example, geosteering can include intentional directional control of a wellbore based on results of downhole geological logging measurements in a manner that aims to keep a directional wellbore within a desired region, zone (e.g., a pay zone), etc. As an example, geosteering may include directing a wellbore to keep the wellbore in a particular section of a reservoir, for example, to minimize gas and/or water breakthrough and, for example, to maximize economic production from a well that includes the wellbore.

Referring again to FIG. 2, the wellsite system 200 can include one or more sensors 264 that are operatively coupled to the control and/or data acquisition system 262. As an example, a sensor or sensors may be at surface locations. As an example, a sensor or sensors may be at downhole locations. As an example, a sensor or sensors may be at one or more remote locations that are not within a distance of the order of about one hundred meters from the wellsite system 200. As an example, a sensor or sensor may be at an offset wellsite where the wellsite system 200 and the offset wellsite are in a common field (e.g., oil and/or gas field).

As an example, one or more of the sensors 264 can be provided for tracking pipe, tracking movement of at least a portion of a drillstring, etc.

As an example, the system 200 can include one or more sensors 266 that can sense and/or transmit signals to a fluid conduit such as a drilling fluid conduit (e.g., a drilling mud conduit). For example, in the system 200, the one or more sensors 266 can be operatively coupled to portions of the standpipe 208 through which mud flows. As an example, a downhole tool can generate pulses that can travel through the mud and be sensed by one or more of the one or more sensors 266. In such an example, the downhole tool can include associated circuitry such as, for example, encoding circuitry that can encode signals, for example, to reduce demands as to transmission. As an example, circuitry at the surface may include decoding circuitry to decode encoded information transmitted at least in part via mud-pulse telemetry. As an example, circuitry at the surface may include encoder circuitry and/or decoder circuitry and circuitry downhole may include encoder circuitry and/or decoder circuitry. As an example, the system 200 can include a transmitter that can generate signals that can be transmitted downhole via mud (e.g., drilling fluid) as a transmission medium.

As an example, one or more portions of a drillstring may become stuck. The term stuck can refer to one or more of varying degrees of inability to move or remove a drillstring from a bore. As an example, in a stuck condition, it might be possible to rotate pipe or lower it back into a bore or, for example, in a stuck condition, there may be an inability to move the drillstring axially in the bore, though some amount of rotation may be possible. As an example, in a stuck condition, there may be an inability to move at least a portion of the drillstring axially and rotationally.

As to the term "stuck pipe", this can refer to a portion of a drillstring that cannot be rotated or moved axially. As an example, a condition referred to as "differential sticking" can be a condition whereby the drillstring cannot be moved (e.g., rotated or reciprocated) along the axis of the bore. Differential sticking may occur when high-contact forces caused by low reservoir pressures, high wellbore pressures, or both, are exerted over a sufficiently large area of the drillstring. Differential sticking can have time and financial cost.

As an example, a sticking force can be a product of the differential pressure between the wellbore and the reservoir and the area that the differential pressure is acting upon. This means that a relatively low differential pressure (delta p) applied over a large working area can be just as effective in sticking pipe as can a high differential pressure applied over a small area.

As an example, a condition referred to as "mechanical sticking" can be a condition where limiting or prevention of motion of the drillstring by a mechanism other than differential pressure sticking occurs. Mechanical sticking can be caused, for example, by one or more of junk in the hole, wellbore geometry anomalies, cement, keyseats or a buildup of cuttings in the annulus.

Figure 3:
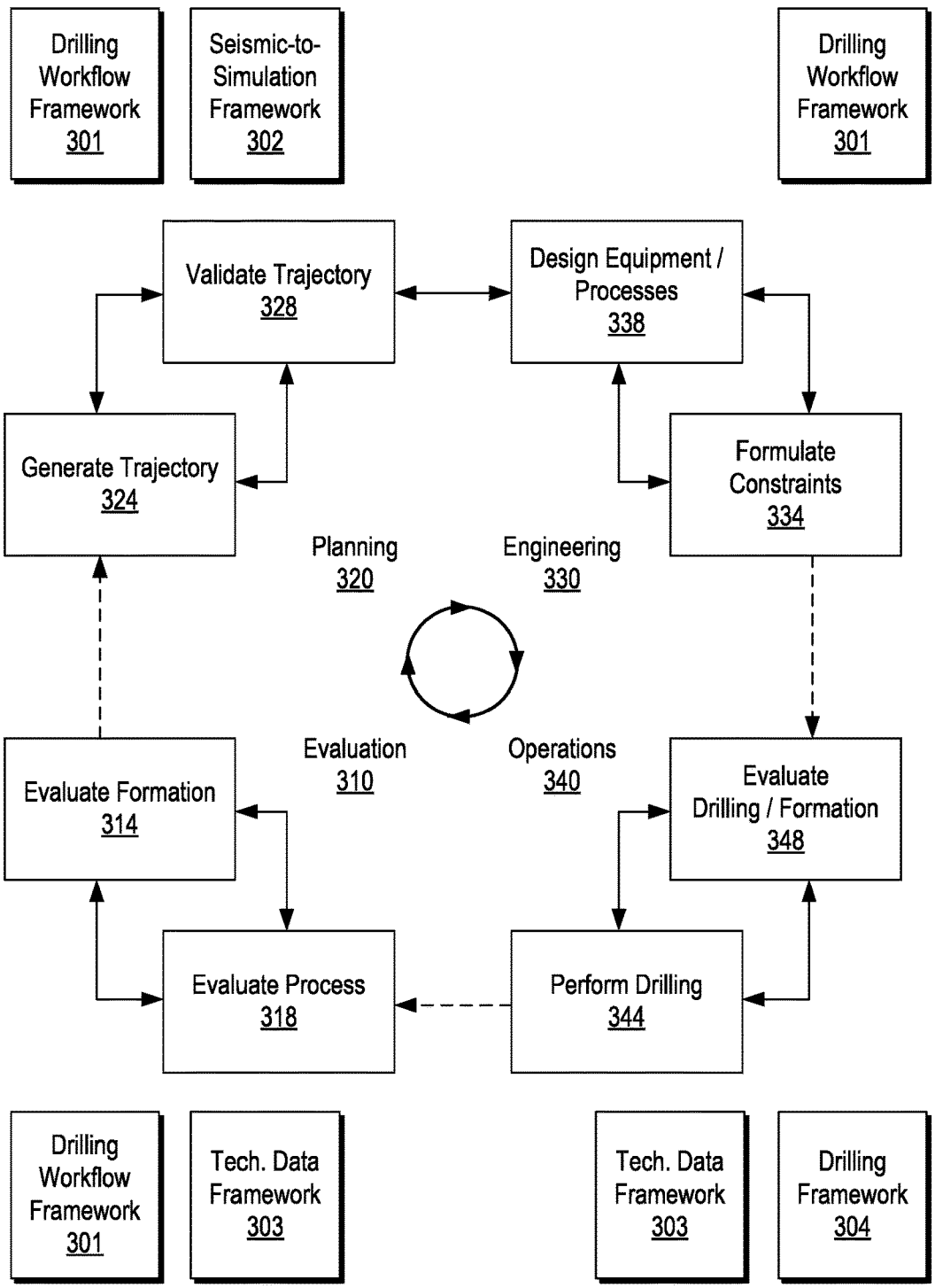
FIG. 3 illustrates an example of a system.

FIG. 3 shows an example of a system 300 that includes various equipment for evaluation 310, planning 320, engineering 330 and operations 340. For example, a drilling workflow framework 301, a seismic-to-simulation framework 302, a technical data framework 303 and a drilling framework 304 may be implemented to perform one or more processes such as a evaluating a formation 314, evaluating a process 318, generating a trajectory 324, validating a trajectory 328, formulating constraints 334, designing equipment and/or processes based at least in part on constraints 338, performing drilling 344 and evaluating drilling and/or formation 348.

In the example of FIG. 3, the seismic-to-simulation framework 302 can be, for example, the PETREL® framework (Schlumberger Limited, Houston, Tex.) and the technical data framework 303 can be, for example, the TECHLOG® framework (Schlumberger Limited, Houston, Tex.).

As an example, a framework can include entities that may include earth entities, geological objects or other objects such as wells, surfaces, reservoirs, etc. Entities can include virtual representations of actual physical entities that are reconstructed for purposes of one or more of evaluation, planning, engineering, operations, etc.

Entities may include entities based on data acquired via sensing, observation, etc. (e.g., seismic data and/or other information). An entity may be characterized by one or more properties (e.g., a geometrical pillar grid entity of an earth model may be characterized by a porosity property). Such properties may represent one or more measurements (e.g., acquired data), calculations, etc.

A framework may be an object-based framework. In such a framework, entities may include entities based on predefined classes, for example, to facilitate modeling, analysis, simulation, etc. An example of an object-based framework is the MICROSOFT™ .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

As an example, a framework can include an analysis component that may allow for interaction with a model or model-based results (e.g., simulation results, etc.). As to simulation, a framework may operatively link to or include a simulator such as the ECLIPSE® reservoir simulator (Schlumberger Limited, Houston, Tex.), the INTERSECT® reservoir simulator (Schlumberger Limited, Houston, Tex.), etc.

The aforementioned PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, well engineers, reservoir engineers, etc.) can develop collaborative workflows and integrate operations to streamline processes. Such a framework may be considered an application and may be considered a data-driven application (e.g., where data is input for purposes of modeling, simulating, etc.).

As an example, one or more frameworks may be interoperative and/or run upon one or another. As an example, consider the framework environment marketed as the OCEAN® framework environment (Schlumberger Limited, Houston, Tex.), which allows for integration of add-ons (or plug-ins) into a PETREL® framework workflow. The OCEAN® framework environment leverages .NET™ tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

As an example, a framework can include a model simulation layer along with a framework services layer, a framework core layer and a modules layer. The framework may include the OCEAN® framework where the model simulation layer can include or operatively link to the PETREL® model-centric software package that hosts OCEAN® framework applications. In an example embodiment, the PETREL® software may be considered a data-driven application. The PETREL® software can include a framework for model building and visualization. Such a model may include one or more grids.

As an example, the model simulation layer may provide domain objects, act as a data source, provide for rendering and provide for various user interfaces. Rendering may provide a graphical environment in which applications can display their data while the user interfaces may provide a common look and feel for application user interface components.

As an example, domain objects can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

As an example, data may be stored in one or more data sources (or data stores, generally physical data storage devices), which may be at the same or different physical sites and accessible via one or more networks. As an example, a model simulation layer may be configured to model projects. As such, a particular project may be stored where stored project information may include inputs, models, results and cases. Thus, upon completion of a modeling session, a user may store a project. At a later time, the project can be accessed and restored using the model simulation layer, which can recreate instances of the relevant domain objects.

As an example, the system 300 may be used to perform one or more workflows. A workflow may be a process that includes a number of worksteps. A workstep may operate on data, for example, to create new data, to update existing data, etc. As an example, a workflow may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable at least in part in the PETREL® software, for example, that operates on seismic data, seismic attribute(s), etc.

As an example, seismic data can be data acquired via a seismic survey where sources and receivers are positioned in a geologic environment to emit and receive seismic energy where at least a portion of such energy can reflect off subsurface structures. As an example, a seismic data analysis framework or frameworks (e.g., consider the OMEGA® framework, marketed by Schlumberger Limited, Houston, Tex.) may be utilized to determine depth, extent, properties, etc. of subsurface structures. As an example, seismic data analysis can include forward modeling and/or inversion, for example, to iteratively build a model of a subsurface region of a geologic environment. As an example, a seismic data analysis framework may be part of or operatively coupled to a seismic-to-simulation framework (e.g., the PETREL® framework, etc.).

As an example, a workflow may be a process implementable at least in part in the OCEAN® framework. As an example, a workflow may include one or more worksteps that access a module such as a plug-in (e.g., external executable code, etc.).

As an example, a framework may provide for modeling petroleum systems. For example, the modeling framework marketed as the PETROMOD® framework (Schlumberger Limited, Houston, Tex.) includes features for input of various types of information (e.g., seismic, well, geological, etc.) to model evolution of a sedimentary basin. The PETROMOD® framework provides for petroleum systems modeling via input of various data such as seismic data, well data and other geological data, for example, to model evolution of a sedimentary basin. The PETROMOD® framework may predict if, and how, a reservoir has been charged with hydrocarbons, including, for example, the source and timing of hydrocarbon generation, migration routes, quantities, pore pressure and hydrocarbon type in the subsurface or at surface conditions. In combination with a framework such as the PETREL® framework, workflows may be constructed to provide basin-to-prospect scale exploration solutions. Data exchange between frameworks can facilitate construction of models, analysis of data (e.g., PETROMOD® framework data analyzed using PETREL® framework capabilities), and coupling of workflows.

As mentioned, a drillstring can include various tools that may make measurements. As an example, a wireline tool or another type of tool may be utilized to make measurements. As an example, a tool may be configured to acquire electrical borehole images. As an example, the fullbore Formation MicroImager (FMI) tool (Schlumberger Limited, Houston, Tex.) can acquire borehole image data. A data acquisition sequence for such a tool can include running the tool into a borehole with acquisition pads closed, opening and pressing the pads against a wall of the borehole, delivering electrical current into the material defining the borehole while translating the tool in the borehole, and sensing current remotely, which is altered by interactions with the material.

Analysis of formation information may reveal features such as, for example, vugs, dissolution planes (e.g., dissolution along bedding planes), stress-related features, dip events, etc. As an example, a tool may acquire information that may help to characterize a reservoir, optionally a fractured reservoir where fractures may be natural and/or artificial (e.g., hydraulic fractures). As an example, information acquired by a tool or tools may be analyzed using a framework such as the TECHLOG® framework. As an example, the TECHLOG® framework can be interoperable with one or more other frameworks such as, for example, the PETREL® framework.

As an example, various aspects of a workflow may be completed automatically, may be partially automated, or may be completed manually, as by a human user interfacing with a software application. As an example, a workflow may be cyclic, and may include, as an example, four stages such as, for example, an evaluation stage (see, e.g., the evaluation equipment 310), a planning stage (see, e.g., the planning equipment 320), an engineering stage (see, e.g., the engineering equipment 330) and an execution stage (see, e.g., the operations equipment 340). As an example, a workflow may commence at one or more stages, which may progress to one or more other stages (e.g., in a serial manner, in a parallel manner, in a cyclical manner, etc.).

As an example, a workflow can commence with an evaluation stage, which may include a geological service provider evaluating a formation (see, e.g., the evaluation block 314). As an example, a geological service provider may undertake the formation evaluation using a computing system executing a software package tailored to such activity; or, for example, one or more other suitable geology platforms may be employed (e.g., alternatively or additionally). As an example, the geological service provider may evaluate the formation, for example, using earth models, geophysical models, basin models, petrotechnical models, combinations thereof, and/or the like. Such models may take into consideration a variety of different inputs, including offset well data, seismic data, pilot well data, other geologic data, etc. The models and/or the input may be stored in the database maintained by the server and accessed by the geological service provider.

As an example, a workflow may progress to a geology and geophysics ("G&G") service provider, which may generate a well trajectory (see, e.g., the generation block 324), which may involve execution of one or more G&G software packages. Examples of such software packages include the PETREL® framework. As an example, a G&G service provider may determine a well trajectory or a section thereof, based on, for example, one or more model(s) provided by a formation evaluation (e.g., per the evaluation block 314), and/or other data, e.g., as accessed from one or more databases (e.g., maintained by one or more servers, etc.). As an example, a well trajectory may take into consideration various "basis of design" (BOD) constraints, such as general surface location, target (e.g., reservoir) location, and the like. As an example, a trajectory may incorporate information about tools, bottom-hole assemblies, casing sizes, etc., that may be used in drilling the well. A well trajectory determination may take into consideration a variety of other parameters, including risk tolerances, fluid weights and/or plans, bottom-hole pressures, drilling time, etc.

As an example, a workflow may progress to a first engineering service provider (e.g., one or more processing machines associated therewith), which may validate a well trajectory and, for example, relief well design (see, e.g., the validation block 328). Such a validation process may include evaluating physical properties, calculations, risk tolerances, integration with other aspects of a workflow, etc. As an example, one or more parameters for such determinations may be maintained by a server and/or by the first engineering service provider; noting that one or more model(s), well trajectory(ies), etc. may be maintained by a server and accessed by the first engineering service provider. For example, the first engineering service provider may include one or more computing systems executing one or more software packages. As an example, where the first engineering service provider rejects or otherwise suggests an adjustment to a well trajectory, the well trajectory may be adjusted or a message or other notification sent to the G&G service provider requesting such modification.

As an example, one or more engineering service providers (e.g., first, second, etc.) may provide a casing design, bottom-hole assembly (BHA) design, fluid design, and/or the like, to implement a well trajectory (see, e.g., the design block 338). In some embodiments, a second engineering service provider may perform such design using one of more software applications. Such designs may be stored in one or more databases maintained by one or more servers, which may, for example, employ STUDIO® framework tools, and may be accessed by one or more of the other service providers in a workflow.

As an example, a second engineering service provider may seek approval from a third engineering service provider for one or more designs established along with a well trajectory. In such an example, the third engineering service provider may consider various factors as to whether the well engineering plan is acceptable, such as economic variables (e.g., oil production forecasts, costs per barrel, risk, drill time, etc.), and may request authorization for expenditure, such as from the operating company's representative, well-owner's representative, or the like (see, e.g., the formulation block 334). As an example, at least some of the data upon which such determinations are based may be stored in one or more database maintained by one or more servers. As an example, a first, a second, and/or a third engineering service provider may be provided by a single team of engineers or even a single engineer, and thus may or may not be separate entities.

As an example, where economics may be unacceptable or subject to authorization being withheld, an engineering service provider may suggest changes to casing, a bottom-hole assembly, and/or fluid design, or otherwise notify and/or return control to a different engineering service provider, so that adjustments may be made to casing, a bottom-hole assembly, and/or fluid design. Where modifying one or more of such designs is impracticable within well constraints, trajectory, etc., the engineering service provider may suggest an adjustment to the well trajectory and/or a workflow may return to or otherwise notify an initial engineering service provider and/or a G&G service provider such that either or both may modify the well trajectory.

As an example, a workflow can include considering a well trajectory, including an accepted well engineering plan, and a formation evaluation. Such a workflow may then pass control to a drilling service provider, which may implement the well engineering plan, establishing safe and efficient drilling, maintaining well integrity, and reporting progress as well as operating parameters (see, e.g., the blocks 344 and 348). As an example, operating parameters, formation encountered, data collected while drilling (e.g., using logging-while-drilling or measuring-while-drilling technology), may be returned to a geological service provider for evaluation. As an example, the geological service provider may then re-evaluate the well trajectory, or one or more other aspects of the well engineering plan, and may, in some cases, and potentially within predetermined constraints, adjust the well engineering plan according to the real-life drilling parameters (e.g., based on acquired data in the field, etc.).

Whether the well is entirely drilled, or a section thereof is completed, depending on the specific embodiment, a workflow may proceed to a post review (see, e.g., the evaluation block 318). As an example, a post review may include reviewing drilling performance. As an example, a post review may further include reporting the drilling performance (e.g., to one or more relevant engineering, geological, or G&G service providers).

Various activities of a workflow may be performed consecutively and/or may be performed out of order (e.g., based partially on information from templates, nearby wells, etc. to fill in any gaps in information that is to be provided by another service provider). As an example, undertaking one activity may affect the results or basis for another activity, and thus may, either manually or automatically, call for a variation in one or more workflow activities, work products, etc. As an example, a server may allow for storing information on a central database accessible to various service providers where variations may be sought by communication with an appropriate service provider, may be made automatically, or may otherwise appear as suggestions to the relevant service provider. Such an approach may be considered to be a holistic approach to a well workflow, in comparison to a sequential, piecemeal approach.

As an example, various actions of a workflow may be repeated multiple times during drilling of a wellbore. For example, in one or more automated systems, feedback from a drilling service provider may be provided at or near real-time, and the data acquired during drilling may be fed to one or more other service providers, which may adjust its piece of the workflow accordingly. As there may be dependencies in other areas of the workflow, such adjustments may permeate through the workflow, e.g., in an automated fashion. In some embodiments, a cyclic process may additionally or instead proceed after a certain drilling goal is reached, such as the completion of a section of the wellbore, and/or after the drilling of the entire wellbore, or on a per-day, week, month, etc. basis.

Well planning can include determining a path of a well that can extend to a reservoir, for example, to economically produce fluids such as hydrocarbons therefrom. Well planning can include selecting a drilling and/or completion assembly which may be used to implement a well plan. As an example, various constraints can be imposed as part of well planning that can impact design of a well. As an example, such constraints may be imposed based at least in part on information as to known geology of a subterranean domain, presence of one or more other wells (e.g., actual and/or planned, etc.) in an area (e.g., consider collision avoidance), etc. As an example, one or more constraints may be imposed based at least in part on characteristics of one or more tools, components, etc. As an example, one or more constraints may be based at least in part on factors associated with drilling time and/or risk tolerance.

As an example, a system can allow for a reduction in waste, for example, as may be defined according to LEAN. In the context of LEAN, consider one or more of the following types of waste: transport (e.g., moving items unnecessarily, whether physical or data); inventory (e.g., components, whether physical or informational, as work in process, and finished product not being processed); motion (e.g., people or equipment moving or walking unnecessarily to perform desired processing); waiting (e.g., waiting for information, interruptions of production during shift change, etc.); overproduction (e.g., production of material, information, equipment, etc. ahead of demand); over Processing (e.g., resulting from poor tool or product design creating activity); and defects (e.g., effort involved in inspecting for and fixing defects whether in a plan, data, equipment, etc.). As an example, a system that allows for actions (e.g., methods, workflows, etc.) to be performed in a collaborative manner can help to reduce one or more types of waste.

As an example, a system can be utilized to implement a method for facilitating distributed well engineering, planning, and/or drilling system design across multiple computation devices where collaboration can occur among various different users (e.g., some being local, some being remote, some being mobile, etc.). In such a system, the various users via appropriate devices may be operatively coupled via one or more networks (e.g., local and/or wide area networks, public and/or private networks, land-based, marine-based and/or areal networks, etc.).

As an example, a system may allow well engineering, planning, and/or drilling system design to take place via a subsystems approach where a wellsite system is composed of various subsystem, which can include equipment subsystems and/or operational subsystems (e.g., control subsystems, etc.). As an example, computations may be performed using various computational platforms/devices that are operatively coupled via communication links (e.g., network links, etc.). As an example, one or more links may be operatively coupled to a common database (e.g., a server site, etc.). As an example, a particular server or servers may manage receipt of notifications from one or more devices and/or issuance of notifications to one or more devices. As an example, a system may be implemented for a project where the system can output a well plan, for example, as a digital well plan, a paper well plan, a digital and paper well plan, etc. Such a well plan can be a complete well engineering plan or design for the particular project.

Figure 4:
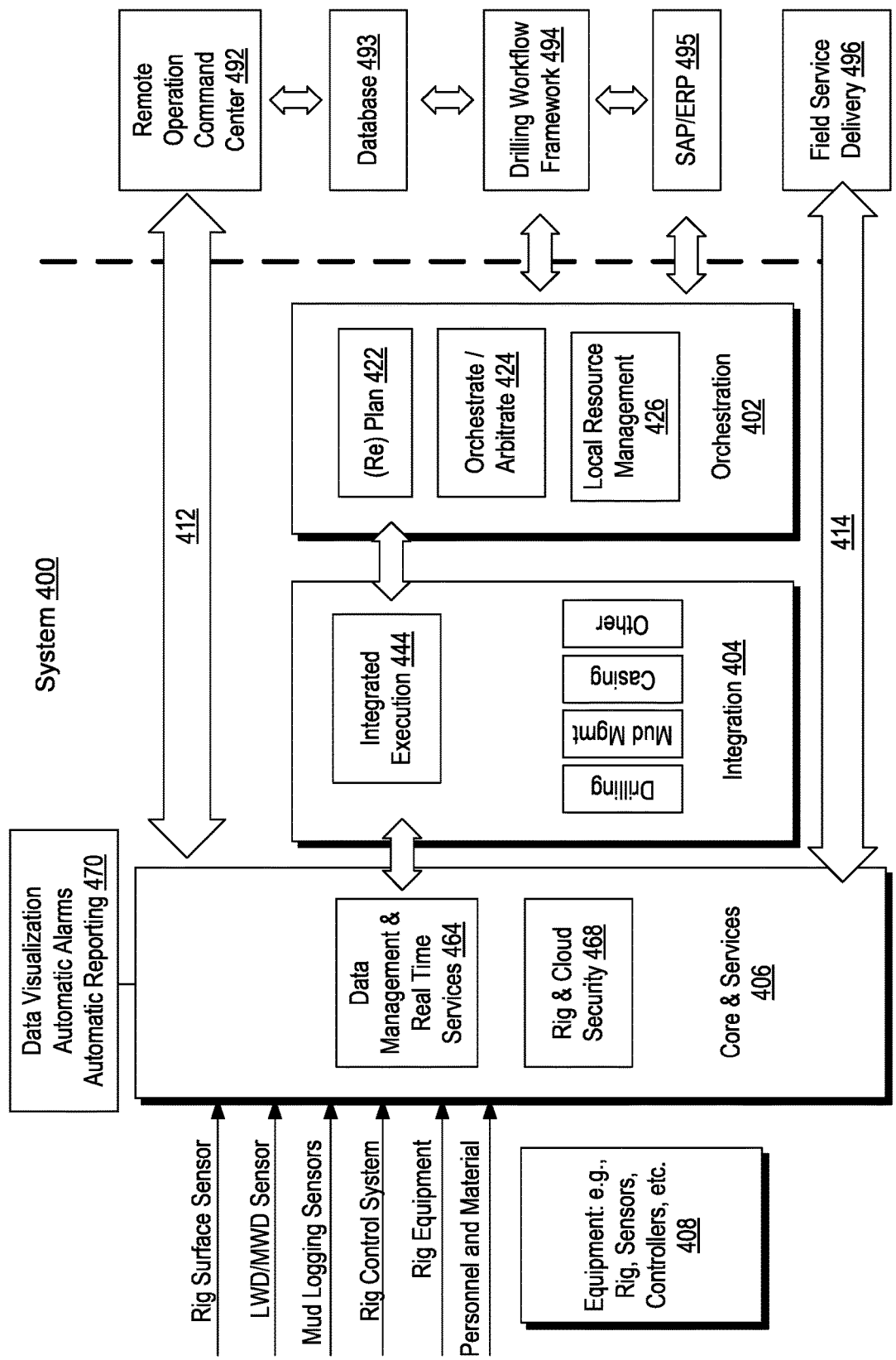
FIG. 4 illustrates an example of a system.

FIG. 4 shows an example of a system 400 that includes various components that can be local to a wellsite and includes various components that can be remote from a wellsite. As shown, the system 400 includes an orchestration block 402, an integration block 404, a core and services block 406 and an equipment block 408. These blocks can be labeled in one or more manners other than as shown in the example of FIG. 4. In the example of FIG. 4, the blocks 402, 404, 406 and 408 can be defined by one or more of operational features, functions, relationships in an architecture, etc.

As an example, the blocks 402, 404, 406 and 408 may be described in a pyramidal architecture where, from peak to base, a pyramid includes the orchestration block 402, the integration block 404, the core and services block 406 and the equipment block 408.

As an example, the orchestration block 402 can be associated with a well management level (e.g., well planning and/or orchestration) and can be associated with a rig management level (e.g., rig dynamic planning and/or orchestration). As an example, the integration block 404 can be associated with a process management level (e.g., rig integrated execution). As an example, the core and services block 406 can be associated with a data management level (e.g., sensor, instrumentation, inventory, etc.). As an example, the equipment block 408 can be associated with a wellsite equipment level (e.g., wellsite subsystems, etc.).

As an example, the orchestration block 402 may receive information from a drilling workflow framework and/or one or more other sources, which may be remote from a wellsite.

In the example of FIG. 4, the orchestration block 402 includes a plan/replan block 422, an orchestrate/arbitrate block 424 and a local resource management block 426. In the example of FIG. 4, the integration block 404 includes an integrated execution block 444, which can include or be operatively coupled to blocks for various subsystems of a wellsite such as a drilling subsystem, a mud management subsystem (e.g., a hydraulics subsystem), a casing subsystem (e.g., casings and/or completions subsystem), and, for example, one or more other subsystems. In the example of FIG. 4, the core and services block 406 includes a data management and real-time services block 464 (e.g., real-time or near real-time services) and a rig and cloud security block 468 (e.g., as to provisioning and various type of security measures, etc.). In the example of FIG. 4, the equipment block 408 is shown as being capable of providing various types of information to the core and services block 406. For example, consider information from a rig surface sensor, a LWD/MWD sensor, a mud logging sensor, a rig control system, rig equipment, personnel, material, etc. In the example, of FIG. 4, a block 470 can provide for one or more of data visualization, automatic alarms, automatic reporting, etc. As an example, the block 470 may be operatively coupled to the core and services block 406 and/or one or more other blocks.

As mentioned, a portion of the system 400 can be remote from a wellsite. For example, to one side of a dashed line appear a remote operation command center block 492, a database block 493, a drilling workflow framework block 494, a SAP/ERP block 495 and a field services delivery block 496. Various blocks that may be remote can be operatively coupled to one or more blocks that may be local to a wellsite system. For example, a communication link 412 is illustrated in the example of FIG. 4 that can operatively couple the blocks 406 and 492 (e.g., as to monitoring, remote control, etc.), while another communication link 414 is illustrated in the example of FIG. 4 that can operatively couple the blocks 406 and 496 (e.g., as to equipment delivery, equipment services, etc.). Various other examples of possible communication links are also illustrated in the example of FIG. 4.

As an example, the system 400 of FIG. 4 may be a field management tool. As an example, the system 400 of FIG. 4 may include a drilling framework (see, e.g., the drilling framework 304). As an example, blocks in the system 400 of FIG. 4 that may be remote from a wellsite.

As an example, a wellbore can be drilled according to a drilling plan that is established prior to drilling. Such a drilling plan, which may be a well plan or a portion thereof, can set forth equipment, pressures, trajectories and/or other parameters that define drilling process for a wellsite. As an example, a drilling operation may then be performed according to the drilling plan (e.g., well plan). As an example, as information is gathered, a drilling operation may deviate from a drilling plan. Additionally, as drilling or other operations are performed, subsurface conditions may change. Specifically, as new information is collected, sensors may transmit data to one or more surface units. As an example, a surface unit may automatically use such data to update a drilling plan (e.g., locally and/or remotely).

As an example, the drilling workflow framework 494 can be or include a G&G system and a well planning system. As an example, a G&G system corresponds to hardware, software, firmware, or a combination thereof that provides support for geology and geophysics. In other words, a geologist who understands the reservoir may decide where to drill the well using the G&G system that creates a three-dimensional model of the subsurface formation and includes simulation tools. The G&G system may transfer a well trajectory and other information selected by the geologist to a well planning system. The well planning system corresponds to hardware, software, firmware, or a combination thereof that produces a well plan. In other words, the well plan may be a high-level drilling program for the well. The well planning system may also be referred to as a well plan generator.

In the example of FIG. 4, various blocks can be components that may correspond to one or more software modules, hardware infrastructure, firmware, equipment, or any combination thereof. Communication between the components may be local or remote, direct or indirect, via application programming interfaces, and procedure calls, or through one or more communication channels.

As an example, various blocks in the system 400 of FIG. 4 can correspond to levels of granularity in controlling operations of associated with equipment and/or personnel in an oilfield. As shown in FIG. 4, the system 400 can include the orchestration block 402 (e.g., for well plan execution), the integration block 404 (e.g., process manager collection), the core and services block 406, and the equipment block 408.

The orchestration block 402 may be referred to as a well plan execution system. For example, a well plan execution system corresponds to hardware, software, firmware or a combination thereof that performs an overall coordination of the well construction process, such as coordination of a drilling rig and the management of the rig and the rig equipment. A well plan execution system may be configured to obtain the general well plan from well planning system and transform the general well plan into a detailed well plan. The detailed well plan may include a specification of the activities involved in performing an action in the general well plan, the days and/or times to perform the activities, the individual resources performing the activities, and other information.

As an example, a well plan execution system may further include functionality to monitor an execution of a well plan to track progress and dynamically adjust the plan. Further, a well plan execution system may be configured to handle logistics and resources with respect to on and off the rig. As an example, a well plan execution system may include multiple sub-components, such as a detailer that is configured to detail the well planning system plan, a monitor that is configured to monitor the execution of the plan, a plan manager that is configured to perform dynamic plan management, and a logistics and resources manager to control the logistics and resources of the well. In one or more embodiments, a well plan execution system may be configured to coordinate between the different processes managed by a process manager collection (see, e.g., the integration block 404). In other words, a well plan execution system can communicate and manage resource sharing between processes in a process manager collection while operating at, for example, a higher level of granularity than process manager collection.

As to the integration block 404, as mentioned, it may be referred to as a process manager collection. In one or more embodiments, a process manager collection can include functionality to perform individual process management of individual domains of an oilfield, such as a rig. For example, when drilling a well, different activities may be performed. Each activity may be controlled by an individual process manager in the process manager collection. A process manager collection may include multiple process managers, whereby each process manager controls a different activity (e.g., activity related to the rig). In other words, each process manager may have a set of tasks defined for the process manager that is particular to the type of physics involved in the activity. For example, drilling a well may use drilling mud, which is fluid pumped into well in order to extract drill cuttings from the well. A drilling mud process manager may exist in a process manager collection that manages the mixing of the drilling mud, the composition, testing of the drilling mud properties, determining whether the pressure is accurate, and performing other such tasks. The drilling mud process manager may be separate from a process manager that controls movement of drill pipe from a well. Thus, a process manager collection may partition activities into several different domains and manages each of the domains individually. Amongst other possible process managers, a process manager collection may include, for example, a drilling process manager, a mud preparation and management process manager, a casing running process manager, a cementing process manager, a rig equipment process manager, and other process managers. Further, a process manager collection may provide direct control or advice regarding the components above. As an example, coordination between process managers in a process manager collection may be performed by a well plan execution system.

As to the core and services block 406 (e.g., CS block), it can include functionality to manage individual pieces of equipment and/or equipment subsystems. As an example, a CS block can include functionality to handle basic data structure of the oilfield, such as the rig, acquire metric data, produce reports, and manages resources of people and supplies. As an example, a CS block may include a data acquirer and aggregator, a rig state identifier, a real-time (RT) drill services (e.g., near real-time), a reporter, a cloud, and an inventory manager.

As an example, a data acquirer and aggregator can include functionality to interface with individual equipment components and sensor and acquire data. As an example, a data acquirer and aggregator may further include functionality to interface with sensors located at the oilfield.

As an example, a rig state identifier can includes functionality to obtain data from the data acquirer and aggregator and transform the data into state information. As an example, state information may include health and operability of a rig as well as information about a particular task being performed by equipment.

As an example, RT drill services can include functionality to transmit and present information to individuals. In particular, the RT drill services can include functionality to transmit information to individuals involved according to roles and, for example, device types of each individual (e.g., mobile, desktop, etc.). In one or more embodiments, information presented by RT drill services can be context specific, and may include a dynamic display of information so that a human user may view details about items of interest.

As an example, in one or more embodiments, a reporter can include functionality to generate reports. For example, reporting may be based on requests and/or automatic generation and may provide information about state of equipment and/or people.

As an example, a wellsite "cloud" framework can correspond to an information technology infrastructure locally at an oilfield, such as an individual rig in the oilfield. In such an example, the wellsite "cloud" framework may be an "Internet of Things" (IoT) framework. As an example, a wellsite "cloud" framework can be an edge of the cloud (e.g., a network of networks) or of a private network.

As an example, an inventory manager can be a block that includes functionality to manage materials, such as a list and amount of each resource on a rig.

In the example of FIG. 4, the equipment block 408 can correspond to various controllers, control unit, control equipment, etc. that may be operatively coupled to and/or embedded into physical equipment at a wellsite such as, for example, rig equipment. For example, the equipment block 408 may correspond to software and control systems for individual items on the rig. As an example, the equipment block 408 may provide for monitoring sensors from multiple subsystems of a drilling rig and provide control commands to multiple subsystem of the drilling rig, such that sensor data from multiple subsystems may be used to provide control commands to the different subsystems of the drilling rig and/or other devices, etc. For example, a system may collect temporally and depth aligned surface data and downhole data from a drilling rig and transmit the collected data to data acquirers and aggregators in core services, which can store the collected data for access onsite at a drilling rig or offsite via a computing resource environment.

As mentioned, the system 400 of FIG. 4 can be associated with a plan where, for example, the plan/replan block 422 can provide for planning and/or re-planning one or more operations, etc.

Figure 5:
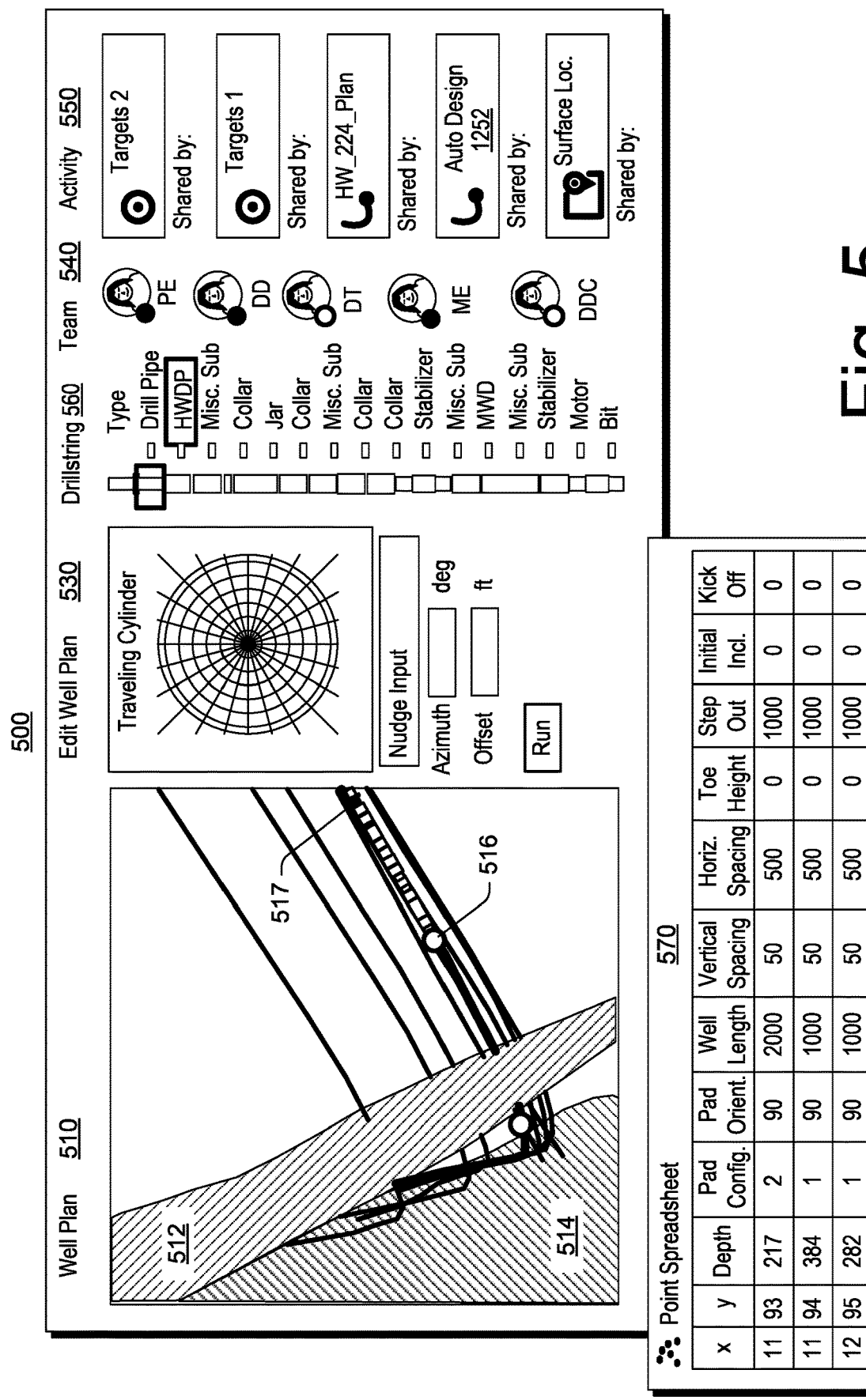
FIG. 5 illustrates an example of a graphical user interface.

FIG. 5 shows an example of a graphical user interface (GUI) 500 that includes information associated with a well plan. Specifically, the GUI 500 includes a panel 510 where surfaces representations 512 and 514 are rendered along with well trajectories where a location 516 can represent a position of a drillstring 517 along a well trajectory. The GUI 500 may include one or more editing features such as an edit well plan set of features 530. The GUI 500 may include information as to individuals of a team 540 that are involved, have been involved and/or are to be involved with one or more operations. The GUI 500 may include information as to one or more activities 550. As shown in the example of FIG. 5, the GUI 500 can include a graphical control of a drillstring 560 where, for example, various portions of the drillstring 560 may be selected to expose one or more associated parameters (e.g., type of equipment, equipment specifications, operational history, etc.). FIG. 5 also shows a table 570 as a point spreadsheet that specifies information for a plurality of wells.

Figure 6:
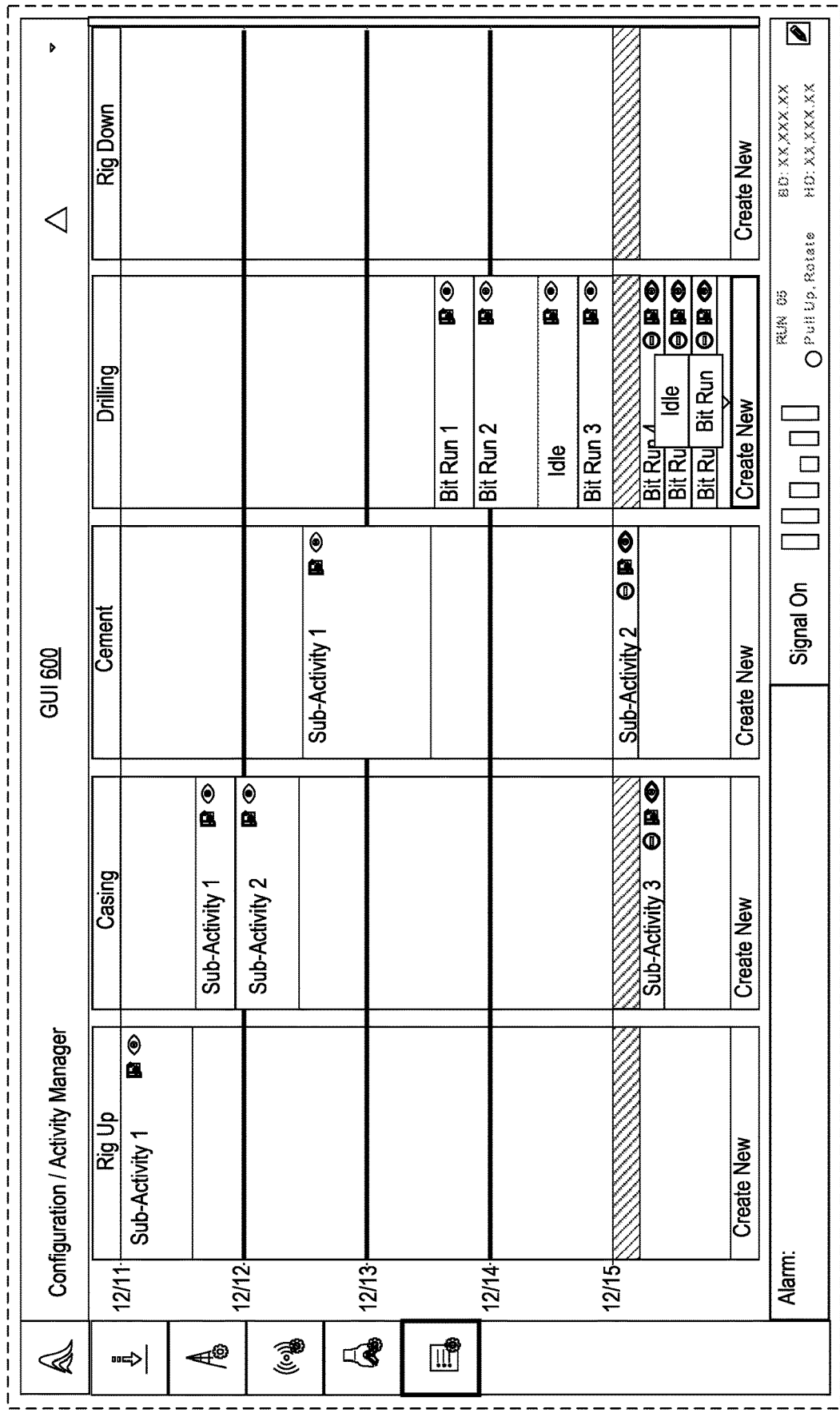
FIG. 6 illustrates an example of a graphical user interface.

FIG. 6 shows an example of a graphical user interface (GUI) 600 that includes a calendar with dates for various operations that can be part of a plan. For example, the GUI 600 shows rig up, casing, cement, drilling and rig down operations that can occur over various periods of time. Such a GUI may be editable via selection of one or more graphical controls.

Various types of data associated with field operations can be 1-D series data. For example, consider data as to one or more of a drilling system, downhole states, formation attributes, and surface mechanics being measured as single or multi-channel time series data.

Figure 7:
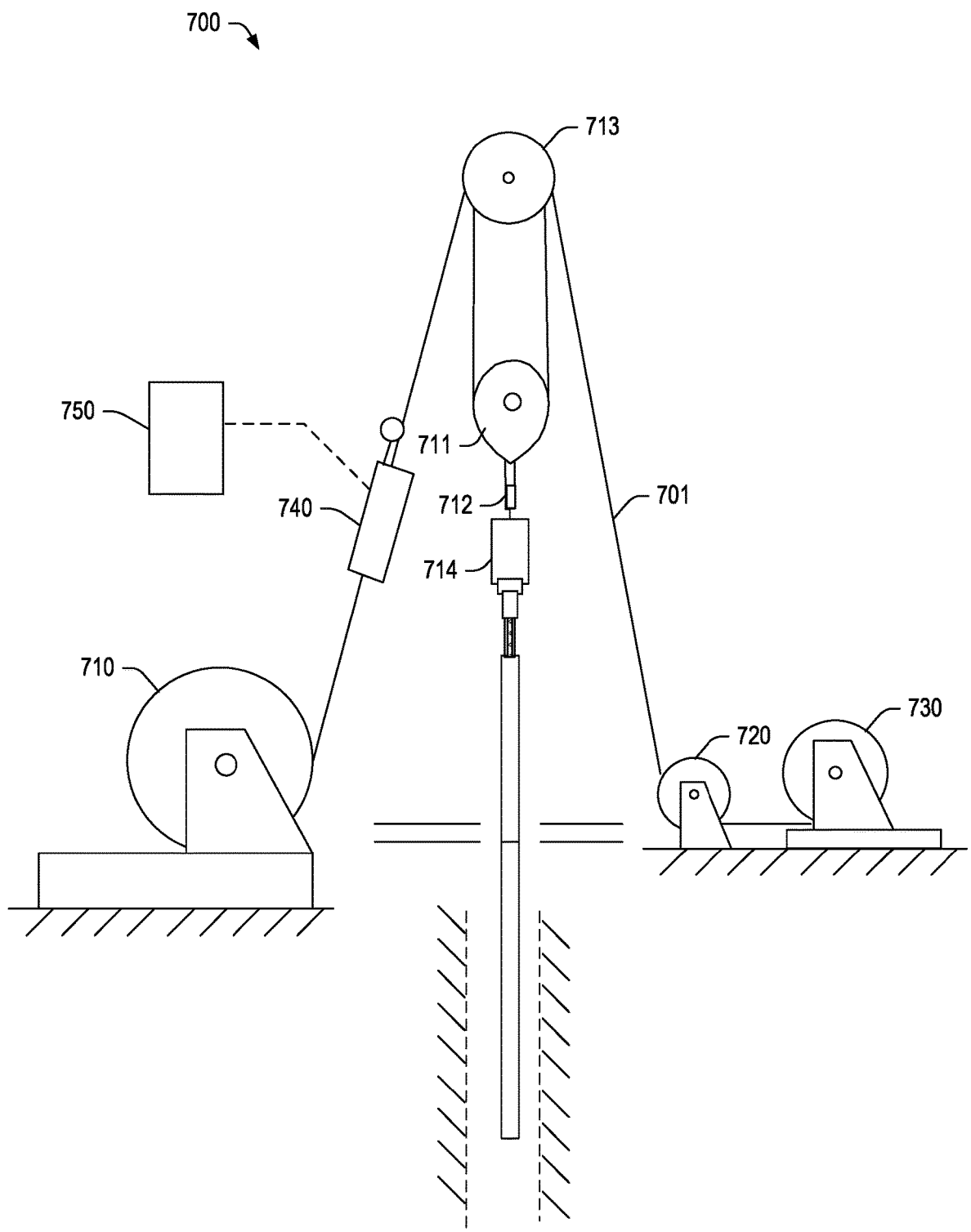
FIG. 7 illustrates an example of a system.

FIG. 7 shows an example of various components of a hoisting system 700, which includes a cable 701, drawworks 710, a traveling block 711, a hook 712, a crown block 713, a top drive 714, a cable deadline tiedown anchor 720, a cable supply reel 730, one or more sensors 740 and circuitry 750 operatively coupled to the one or more sensors 740. In the example of FIG. 7, the hoisting system 700 can include various sensors, which may include one or more of load sensors, displacement sensors, accelerometers, etc. As an example, the cable deadline tiedown anchor 720 may be fit with a load cell (e.g., a load sensor).

The hoisting system 700 may be part of a wellsite system (see, e.g., FIG. 1 and FIG. 2). In such a system, a measurement channel can be a block position measurement channel, referred to as BPOS, which provides measurements of a height of a traveling block, which may be defined about a deadpoint (e.g., zero point) and may have deviations from that deadpoint in positive and/or negative directions. For example, consider a traveling block that can move in a range of approximately −5 meters to +45 meters, for a total excursion of approximately 50 meters. In such an example, a rig height can be greater than approximately 50 meters (e.g., a crown block can be set at a height from the ground or rig floor in excess of approximately 50 meters). While various examples are given for land-based field operations (e.g., fixed, truck-based, etc.), various methods can apply for marine-based operations (e.g., vessel-based rigs, platform rigs, etc.).

BPOS is a type of real-time channel that reflects surface mechanical properties of a rig. Another example of a channel is hookload, which can be referred to as HKLD. HKLD can be a 1-D series measurement of the load of a hook. As to a derivative, a first derivative can be a load velocity and a second derivative can be a load acceleration. Such data channels can be utilized to infer and monitor various operations and/or conditions. In some examples, a rig may be represented as being in one or more states, which may be referred to as rig states.

As to the HKLD channel, it can help to detect if a rig is "in slips", while the BPOS channel can be a primary channel for depth tracking during drilling. For example, BPOS can be utilized to determine a measured depth in a geologic environment (e.g., a borehole being drilled, etc.). As to the condition or state "in slips", HKLD is at a much lower value than in the condition or state "out of slips".

The term slips refers to a device or assembly that can be used to grip a drillstring (e.g., drillcollar, drillpipe, etc.) in a relatively non-damaging manner and suspend it in a rotary table. Slips can include three or more steel wedges that are hinged together, forming a near circle around a drillpipe. On the drillpipe side (inside surface), the slips are fitted with replaceable, hardened tool steel teeth that embed slightly into the side of the pipe. The outsides of the slips are tapered to match the taper of the rotary table. After the rig crew places the slips around the drillpipe and in the rotary, a driller can control a rig to slowly lower the drillstring. As the teeth on the inside of the slips grip the pipe, the slips are pulled down. This downward force pulls the outer wedges down, providing a compressive force inward on the drillpipe and effectively locking components together. Then the rig crew can unscrew the upper portion of the drillstring (e.g., a kelly, saver sub, a joint or stand of pipe) while the lower part is suspended. After some other component is screwed onto the lower part of the drillstring, the driller raises the drillstring to unlock the gripping action of the slips, and a rig crew can remove the slips from the rotary.

A hookload sensor can be used to measure a weight of load on a drillstring and can be used to detect whether a drillstring is in-slips or out-of-slips. When the drill string is in-slips, motion from the blocks or motion compensator do not have an effect on the depth of a drill bit at the end of the drillstring (e.g., it will tend to remain stationary). Where movement of a traveling block is via a drawworks encoder (DWE), which can be mounted on a shaft of the drawworks, acquired DWE information (e.g., BPOS) does not augment the recorded drill bit depth. When a drillstring is out-of-slips (e.g., drilling ahead), DWE information (e.g., BPOS) can augment the recorded bit depth. The difference in hookload weight (HKLD) between in-slips and out-of-slips tends to be distinguishable. As to marine operations, heave of a vessel can affect bit depth whether a drillstring is in-slips or out-of-slips. As an example, a vessel can include one or more heave sensors, which may sense data that can be recorded as 1-D series data.

As to marine operations, a vessel may experience various types of motion, such as, for example, one or more of heave, sway and surge. Heave is a linear vertical (up/down) motion, sway is linear lateral (side-to-side or port-starboard) motion, and surge is linear longitudinal (front/back or bow/stern) motion imparted by maritime conditions. As an example, a vessel can include one or more heave sensors, one or more sway sensors and/or one or more surge sensors, each of which may sense data that can be recorded as 1-D series data.

As an example, BPOS alone, or combined with one or more other channels, can be used to detect whether a rig is "on bottom" drilling or "tripping", etc. An inferred state may be further consumed by one or more systems such as, for example, an automatic drilling control system, which may be a dynamic field operations system or a part thereof. In such an example, the conditions, operations, states, etc., as discerned from BPOS and/or other channel data may be predicates to making one or more drilling decisions, which may include one or more control decisions (e.g., of a controller that is operatively coupled to one or more pieces of field equipment, etc.).

A block can be a set of pulleys used to gain mechanical advantage in lifting or dragging heavy objects. There can be two blocks on a drilling rig, the crown block and the traveling block. Each can include several sheaves that are rigged with steel drilling cable or line such that the traveling block may be raised (or lowered) by reeling in (or out) a spool of drilling line on the drawworks. As such, block position can refer to the position of the traveling block, which can vary with respect to time. FIG. 1 shows the traveling block assembly 175, FIG. 2 shows the traveling block 211 and FIG. 7 shows the traveling block 711.

A hook can be high-capacity J-shaped equipment used to hang various equipment such as a swivel and kelly, elevator bails, or a topdrive. FIG. 7 shows the hook 712 as operatively coupled to a topdrive 714. As shown in FIG. 2, a hook can be attached to the bottom of the traveling block 211 (e.g., part of the traveling block assembly 175 of FIG. 1). A hook can provide a way to pick up heavy loads with a traveling block. The hook may be either locked (e.g., a normal condition) or free to rotate, so that it may be mated or decoupled with items positioned around the rig floor, etc.

Hookload can be the total force pulling down on a hook as carried by a traveling block. The total force includes the weight of the drillstring in air, the drill collars and any ancillary equipment, reduced by forces that tend to reduce that weight. Some forces that might reduce the weight include friction along a bore wall (especially in deviated wells) and buoyant forces on a drillstring caused by its immersion in drilling fluid (e.g., and/or other fluid). If a blowout preventer (BOP) (e.g., or BOPs) is closed, pressure in a bore acting on cross-sectional area of a drillstring in the BOP can also exert an upward force.

A standpipe can be a rigid metal conduit that provides a high-pressure pathway for drilling fluid to travel approximately one-third of the way up the derrick, where it connects to a flexible high-pressure hose (e.g., kelly hose). A large rig may be fitted with more than one standpipe so that downtime is kept to a minimum if one standpipe demands repair. FIG. 2 shows the standpipe 208 as being a conduit for drilling fluid (e.g., drilling mud, etc.). Pressure of fluid within the standpipe 208 can be referred to as standpipe pressure.

As to surface torque, such a measurement can be provided by equipment at a rig site. As an example, one or more sensors can be utilized to measure surface torque, which may provide for direct and/or indirect measurement of surface torque associated with a drillstring. As an example, equipment can include a drill pipe torque measurement and controller system with one or more of analog frequency output and digital output. As an example, a torque sensor may be associated with a coupling that includes a resilient element operatively joining an input element and an output element where the resilient element allows the input and output elements to twist with respect to one another in response to torque being transmitted through the torque sensor where the twisting can be measured and used to determine the torque being transmitted. As an example, such a coupling can be located between a drive and drill pipe. As an example, torque may be determined via an inertia sensor or sensors. As an example, equipment at a rig site can include one or more sensors for measurement and/or determination of torque (e.g., in units of Nm, etc.).

As an example, equipment can include a real-time drilling service system that may provide data such as weight transfer information, torque transfer information, equivalent circulation density (ECD) information, downhole mechanical specific energy (DMSE) information, motion information (e.g., as to stall, stick-slip, etc.), bending information, vibrational amplitude information (e.g., axial, lateral and/or torsional), rate of penetration (ROP) information, pressure information, differential pressure information, flow information, etc. As an example, sensor information may include inclination, azimuth, total vertical depth, etc. As an example, a system may provide information as to whirl (e.g., backward whirl, etc.) and may optionally provide information such as one or more alerts (e.g., "severe backward whirl: stop and restart with lower surface RPM", etc.).

As an example, a drillstring can include a tool or tools that include various sensors that can make various measurements. For example, consider the OPTIDRILL™ tool (Schlumberger Limited, Houston, Tex.), which includes strain gauges, accelerometers, magnetometer(s), gyroscope(s), etc. For example, such a tool can acquire weight on bit measurements (WOB) using a strain gauge (e.g., 10 second moving window with bandwidth of 200 Hz), torque measurements using a strain gauge (e.g., 10 second moving window with bandwidth of 200 Hz), bending moment using a strain gauge (e.g., 10 second moving window with bandwidth of 200 Hz), vibration using one or more accelerometers (e.g., 30 second RMS with bandwidth of 0.2 to 150 Hz), rotational speed using a magnetometer and a gyroscope (e.g., 30 moving window with bandwidth of 4 Hz), annular and internal pressures using one or more strain gauges (e.g., 1 second average with bandwidth of 200 Hz), annular and internal temperatures using one or more temperature sensors (1 second average with bandwidth of 10 Hz), and continuous inclination using an accelerometer (30 second average with bandwidth of 10 Hz).

As mentioned, channels of real time drilling operation data can be received and characterized using generated synthetic data, which may be generated based at least in part on one or more operational parameters associated with the real time drilling operation. Such real time drilling operation data can include surface data and/or downhole data. As mentioned, data availability may differ temporally (e.g., frequency, gaps, etc.) and/or otherwise (e.g., resolution, etc.). Such data may differ as to noise level and/or noise characteristics.

As an example, the dynamics of a rig drilling system (e.g., a dynamic system) can be modeled as follows:

$$F(P,E,U) \rightarrow Z$$

where P is the plant of the rig mechanical system, E the environment (e.g., formation, etc.), U the rig controls (e.g., the topdrive RPM, the flow rate FLWI etc.) and Z the measurement (e.g., the hookload, etc.).

The dynamics of a system can be further described with a non-linear Kalman filter. Such a Kalman filter can include components of internal states, inputs, measurements, and transfer functions. For example, consider the following equations:

$$X_{t+1} \leftarrow (X_t) + b(U_t) + w_t$$

$$Z_{t+1} \leftarrow h(X_{t+1}) + v_t$$

where $f$ and $b$ are transfer functions for the internal state $X_t$ and the input $U_t$, h is the measurement function and where w and V are noise factors (e.g., process and observation noises, respectively), which can be combined into $f$ and h, and rewritten as follows:

$$X_t \leftarrow f(X_{t-1}) + b(U_{t-w:t})$$

$$Z_t \leftarrow h(X_t)$$

A Kalman filter can be utilized in control of a system and can make optimal use of imprecise data with Gaussian errors to continuously update the best estimate of the system's current state where the system is a dynamic system (e.g., a system that can change over time).

A Kalman filter can be described by a set of equations that provides an efficient computational (recursive) means to estimate the state of a process, in a way that minimizes the mean of the squared error. A Kalman filter can support estimations of past, present, and even future states, and it can do so even when the precise nature of the modeled system is unknown.

A Kalman filter can operate using a prediction process and an update process. In the prediction process, a Kalman filter can produce estimates of current state variables, along with their uncertainties. Once the outcome of the next measurement (e.g., as may be corrupted with some amount of error such as random noise, etc.) is observed, these estimates can be updated in the update process using a weighted average, with more weight being given to estimates with higher certainty. A Kalman filter is recursive and it can operate in real time, using the present input measurements and the previously calculated state and its uncertainty matrix. A Kalman filter does not necessarily assume that errors are Gaussian; however, the Kalman filter yields a conditional probability estimate in the special case that errors are Gaussian.

A Kalman filter may be applied where an internal state is much larger (more degrees of freedom) than the few "observable" parameters that can be measured. However, by combining a series of measurements, a Kalman filter may be utilized to estimate an entire internal state of a dynamic system.

Kalman filters can be based on linear dynamical systems discretized in a time domain. They can be modeled on a Markov chain built on linear operators perturbed by errors that may include Gaussian noise. A state of a system may be represented as a vector of real numbers. As an example, at each discrete time increment, an operator may be applied to the state to generate a new state, with some noise mixed in, and optionally some information from controls on the system (e.g., to an extent they are known or otherwise estimated). Then, another operator mixed with more noise may be implemented to generate observed outputs from the true ("hidden") state. A Kalman filter may be compared to a hidden Markov model (HMM), with a difference being that the hidden state variables take values in a continuous space (as opposed to a discrete state space as in the hidden Markov model).

In some instances, unmodeled dynamics can degrade Kalman filter performance, even where the Kalman filter was supposed to work with unknown stochastic signals as inputs. Such scenarios can be due to the effect of unmodeled dynamics that depend on the input, and, therefore, can bring the estimation technique to instability (e.g., divergence). However, independent white noise signals will, in general, not result in divergence.

The foregoing equations are for a type of Kalman filter that can be referred to as a non-linear Kalman filter or, for example, an extended Kalman filter. For a non-linear Kalman filter, the state transition and observation models can be other than linear functions of the state and can be differentiable functions. The aforementioned process and observation noises can be assumed to be zero mean multivariate Gaussian noises with respective covariances. The function $f$ can be used to compute the predicted state from the previous estimate and the function h can be used to compute the predicted measurement from the predicted state. As an example, a matrix of partial derivatives (e.g., Jacobian or Jacobian matrix) can be computed where, at each time step, the Jacobian is evaluated with current predicted states. Such matrices can be used in the Kalman filter equations. An extended Kalman filter can linearize a non-linear function around the current estimate.

Figure 8:
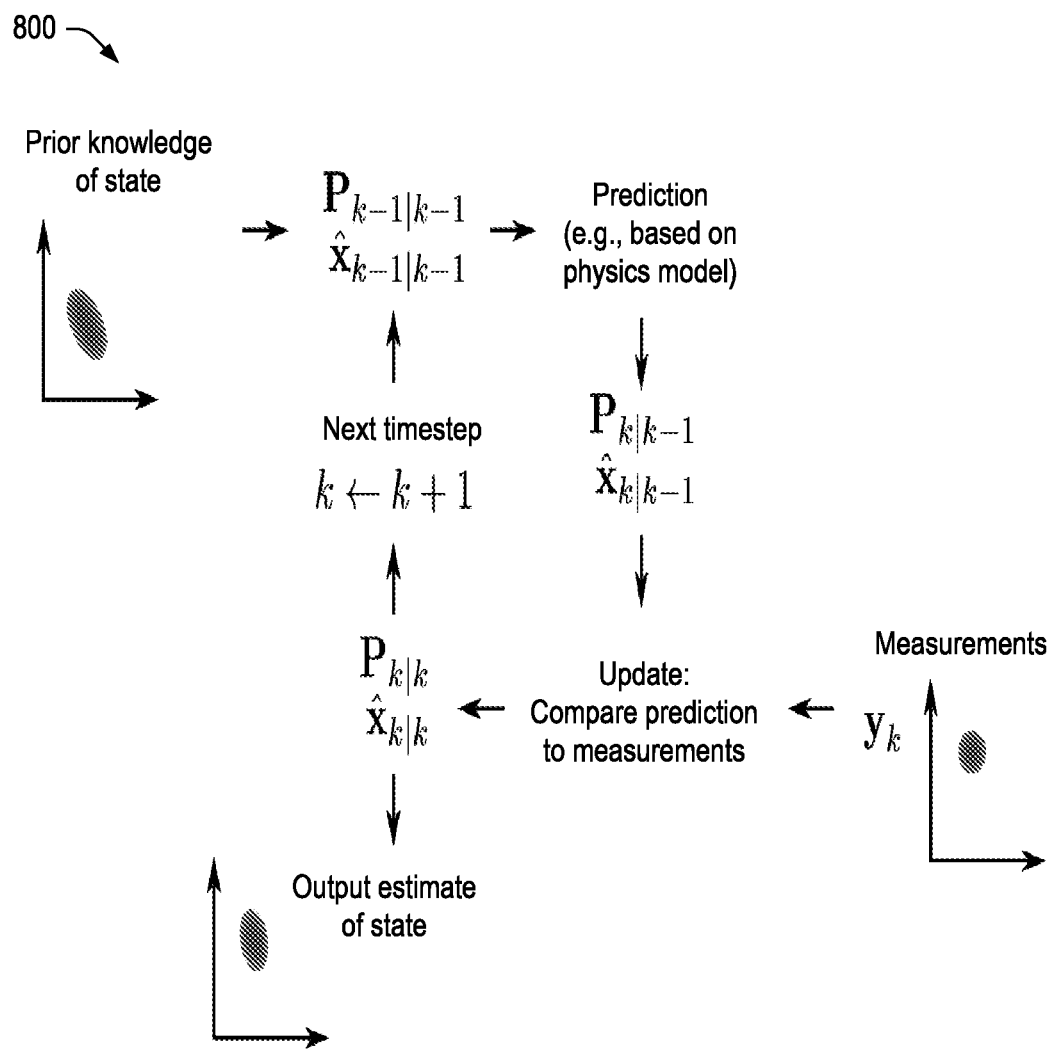
FIG. 8 illustrates an example of a Kalman filter that represents a system.

FIG. 8 shows an example of a Kalman filter 800 that includes a prediction process and an update process, where the update is based on measurements and output of the prediction process. The update process provides for output of a state estimate as well as feedback (e.g., recursion) for the prediction process at a subsequent iteration (e.g., a next time increment). As indicated, prior knowledge of a state can be an input that is used in combination with output of the update process by the prediction process. As indicated, the prediction process may be based on a physical model of a system (e.g., a dynamic system).

As an example, a method can include using a deep Kalman filter to evaluate field operations with respect to one or more pre-defined operational procedures. Such a deep Kalman filter can be a non-linear Kalman filter that utilizes a neural network that can be trained to "learn" filter functions. Such an approach can, for example, provide a solution of a deep neural network-based Kalman filter that learns from real data (e.g., time series data), characterizes different dynamic system responses and conditions the data. As an example, transfer functions can be modeled using a deep neural network (DNN), which can implement a non-linear Kalman filter model and solve for the transfer functions via training with real data (e.g., multi-channel time series data, etc.).

As an example, a pre-defined operational procedure (OP) can be a standard operation procedure or standard operating procedure or standard operational procedure, which can be abbreviated as SOP. In various examples, well construction as a dynamic system process (e.g., or processes) is described noting that an OP or SOP may be defined for a different type of dynamic system or dynamic system process(es). The comparison of one or more SOPs in well construction with an actual operation sequence can improve well construction design and/or well construction (e.g., actual construction operations). As an example, such a comparison or comparisons may help to mitigate and/or prevent future well construction issues. As an example, a method can evaluate whether and how well SOPs have been followed and/or are being followed in the execution of a well plan.

Traditionally, the comparison of a well construction operation with a SOP is based on human "gut feel" without a proper measurement. Compared with a method that depends on laborious manual analysis, an automated method using a computational framework provides a systematic way to analyze the plan SOP versus actual execution in depth, improve analytic accuracy, and reduce processing time and cost. Further, a system can be operatively coupled to equipment at a rig site such that real time assessments can be made, which can be utilized to control one or more rig site operations.

As mentioned, a system such as a drilling system can be described to include rig and formation with non-linear Kalman filter equations. As an example, a computational framework can model functions in the Kalman filter with a machine learning model, which can be referred to as a machine model, which can be a neural network model (e.g., or simply neural network). As an example, a neural network can be trained with an actual time series dataset and provide a solution for Kalman filter equations.

As an example, a pre-defined operating procedure (OP) can be defined as a sequence of internal states and inputs as modeled in the Kalman filter equations, and then compared with an actual operation sequence in a latent space of the neural network (e.g., an encoded feature space) that includes information generated by the trained neural network.

Figure 9:
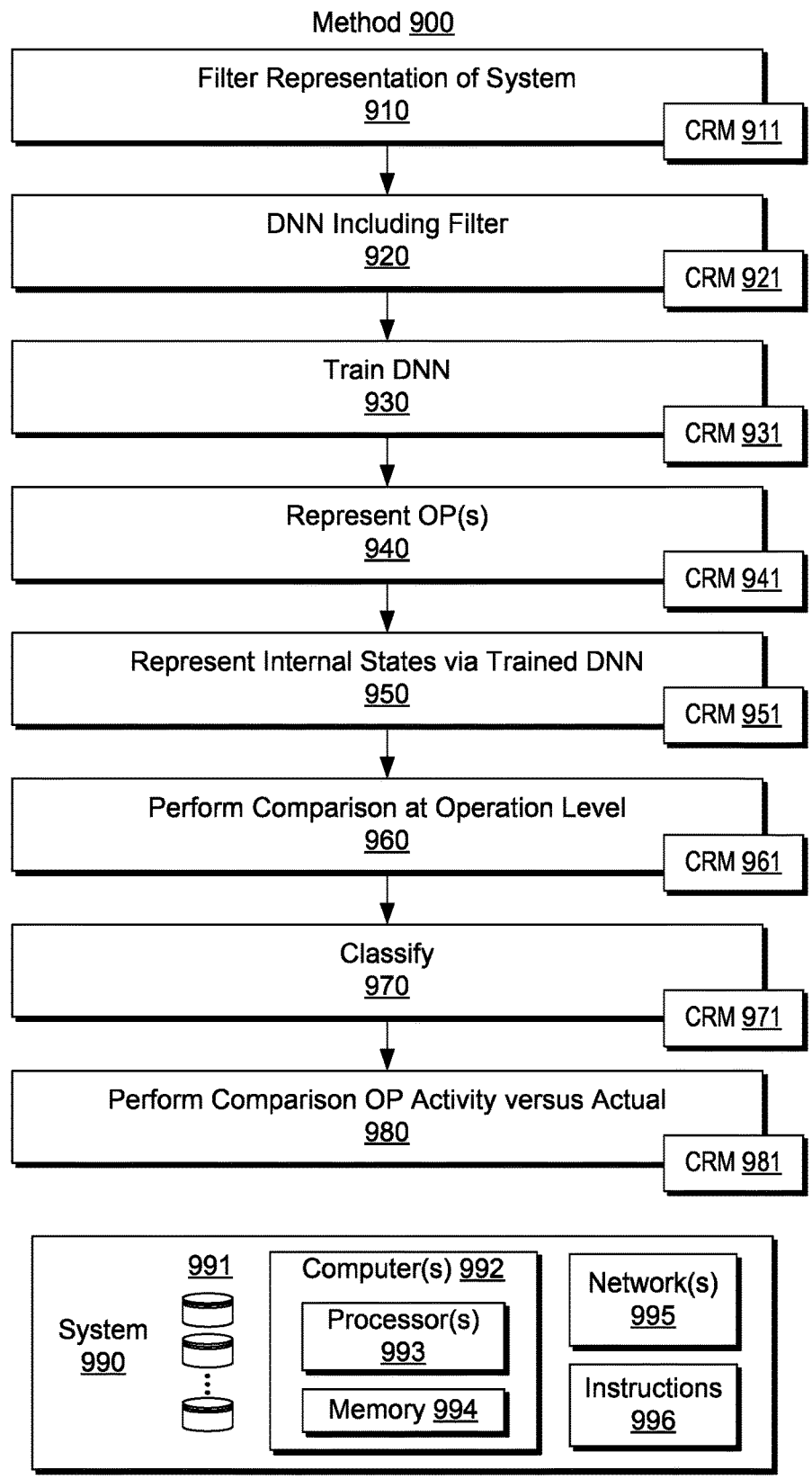
FIG. 9 illustrates an example of a method and an example of a system.

FIG. 9 shows an example of a method 900, which can include a filter block 910 for using a non-linear Kalman filter to describe the dynamics of a rig drilling system; a DNN block 920 for using a deep neural network (DNN) to represent functions in the Kalman filter; a train block 930 for training the DNN with an actual drilling dataset; a representation block 940 for representing one or more OPs via a simulated control sequence(s), activity labels, and corresponding internal states by the trained DNN; a representation block 950 for representing the actual operation with the internal states by the trained DNN; a performance block 960 for performing an operation-level comparison using a comparison function C to evaluate one of the OPs versus actual operation; a classification block 970 for classifying by assigning one or more OP labels using the comparison function C; and a performance block 980 for performing an activity-level comparison using the comparison function C to evaluate an activity in OP versus corresponding activity in an actual operation sequence. Such a method can include a control block for controlling one or more pieces of equipment at a rig site to improve well construction. For example, based on a comparison, a well plan can be adjusted such that one or more operations are performed that improve well construction.

As explained, classification can assign an OP label to actual measured data; noting that the DNN is not trained with the OP label but rather the DNN is utilized in an unsupervised manner. As an example, a method can include predicting an input and response pair and using internal states (see, e.g., FIG. 20) for label assignment through a comparison function (see, e.g., FIG. 14). In such a manner, label assignment is implemented through the comparison function.

FIG. 9 also shows various computer-readable media (CRM) blocks 911, 921, 931, 941, 951, 961, 971 and 981 as associated with the blocks 910, 920, 930, 940, 950, 960, 970 and 980. Such blocks can include instructions that are executable by one or more processors, which can be one or more processors of a computational framework, a system, a computer, etc. A computer-readable medium can be a computer-readable storage medium that is not a signal, not a carrier wave and that is non-transitory. For example, a computer-readable medium can be a physical memory component that can store information in a digital format.

In the example of FIG. 9, a system 990 includes one or more information storage devices 991, one or more computers 992, one or more networks 995 and instructions 996. As to the one or more computers 992, each computer may include one or more processors (e.g., or processing cores) 993 and memory 994 for storing the instructions 996, for example, executable by at least one of the one or more processors. As an example, a computer may include one or more network interfaces (e.g., wired or wireless), one or more graphics cards, a display interface (e.g., wired or wireless), etc. The system 990 may be utilized for performing one or more actions of the method 900. As an example, the instructions 996 can include instructions of one or more of the CRM blocks 911, 921, 931, 941, 951, 961, 971 and 981.

As an example, given an OP and an actual operation sequence, such as "go on bottom in drilling", the method 900 can answer the question "how well does the actual operation of the dynamic system follow the OP?" And, for example: "If not completely followed, where it does not follow well?"

The method 900 can provide a quantitative way to measure variation between an OP and an actual operation sequence.

As mentioned, currently, comparison of a well construction operation with an OP is based on human "gut feel" without a proper measurement as to compliance. Compared with such a manual approach that depends on laborious manual analysis, the method 900 can provide a systematic way to analyze a plan OP versus actual execution in depth, which can improve the analytic accuracy and, for example, reduce processing time and cost. As mentioned, the method 900 can be utilized in a control operation. For example, the method 900 may be implemented by the system 990 where the system 990 is operatively coupled to one or more pieces of equipment that can be controlled via issuance of one or more signals, commands, etc., to improve one or more well construction operations. As an example, control may be effectuated via updating a well plan. For example, the GUI 600 may be updated using output of the method 900 of FIG. 9 where the GUI 600 may be rendered to a display via execution of instructions by the system 990 where the system 990 is operatively coupled to the display. In such an example, the GUI 600 can be update, optionally during well construction such that the well plan is improved and hence well construction improved. The method 900 is a practical application of a DNN and a Kalman filter where the Kalman filters represents temporally operation of equipment at a site such as a rig site where equipment can operate to construct one or more features of a well (e.g., drilling a borehole, cleaning, cementing, fracturing, casing, perforating, logging, etc.).

As mentioned, a Kalman filter representation of system dynamics may be utilized where, for example:

$$F(P,E,U) \leftarrow Z$$

Or $F(X,U) \leftarrow Z$ where:
P: plant; the rig mechanical system
E: environment; the Earth, formations, etc.
U: rig controls; the topdrive RPM, the flow rate FLWI, etc.
Z: the measurement; the hookload HKLD, the standpipe pressure SPPA, etc.
X: the internal state; {P, E}

The internal state, as presented above, can include aspects of a mechanical system (e.g., including associated fluid systems, electrical systems, etc.) and aspects of a geologic environment. For one or more well construction operations, an internal state can represent physical conditions of equipment at a rigsite and physical conditions of the geological environment where interactions occur between the equipment and the geological environment. As an example, drilling fluid introduced into a borehole in a formation can affect the formation (e.g., pores, pore fluid, temperature, pressure, chemical reactions, etc.). As an example, cement introduced into a borehole in a formation can affect the formation (e.g., pores, pore fluid, temperature, pressure, chemical reactions, etc.). As an example, a hydraulic fracturing operation can be a well construction operation that introduces high pressure fracturing fluid into a well in a formation where perforations in a well tubular can allow for the flow of the high pressure fracturing fluid into the formation to generate fractures that are in fluid communication with the well where the formation can include reservoir fluid that can flow from the fractures to the well. As an example, drilling into a formation can break rock of the formation, which may be transported to surface via drilling fluid. The foregoing equations can represent such interactions and/or interdependencies. Representations of internal states can be utilized to control equipment, for example, to target one or more well construction parameters (e.g., time, position, integrity, production potential, etc.).

Figure 10:
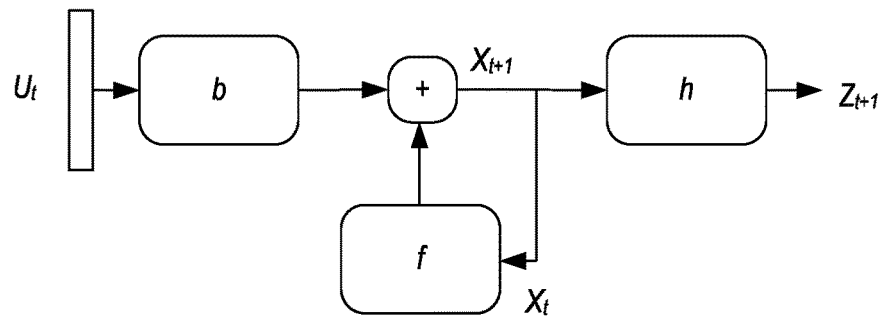
FIG. 10 illustrates examples of systems.
Figure 10:
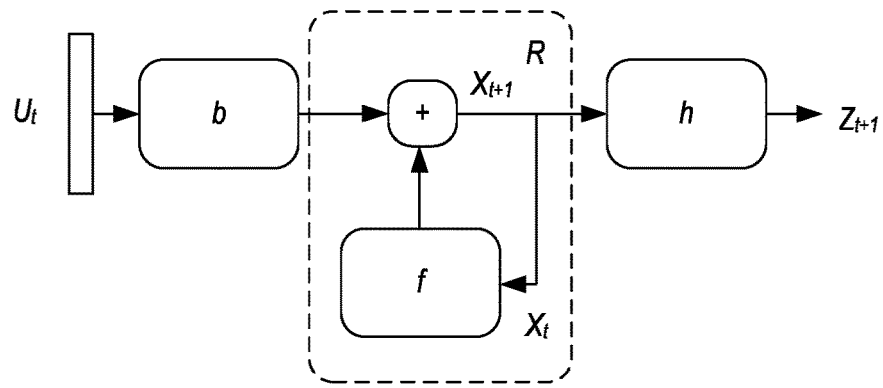
Figure 10:
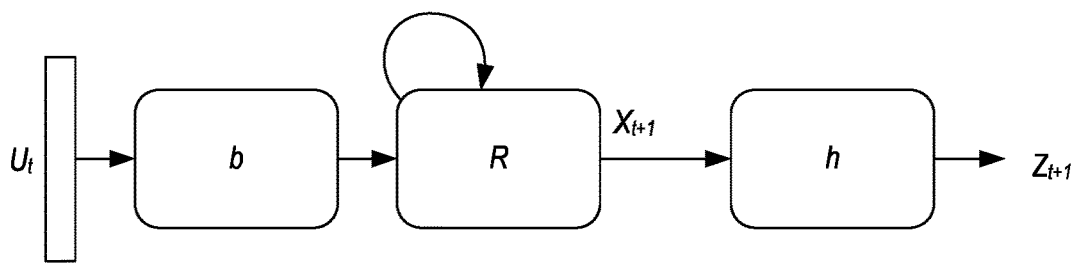

FIG. 10 shows the foregoing equations for a Kalman filter representation of system dynamics represented in one or more examples of system block diagrams 1010, 1030 and 1050. In the system 1010, a component $f$ and a summation operation can be cast as a recurrent component R in the system 1030. The system 1050 shows a neural network with components that represent the system 1030.

The system 1050 can include a neural network that can be trained using appropriate data, as may be acquired from well construction operations, which may be for one or more wells other than a subject well. For example, the neural network of the system 1050 can be trained using offset well data for well construction operations performed at one or more wells that are other than a subject well. In the example of system 1050, the functions b (transfer function), R, and h (measurement function) can become available through such training.

Figure 11:
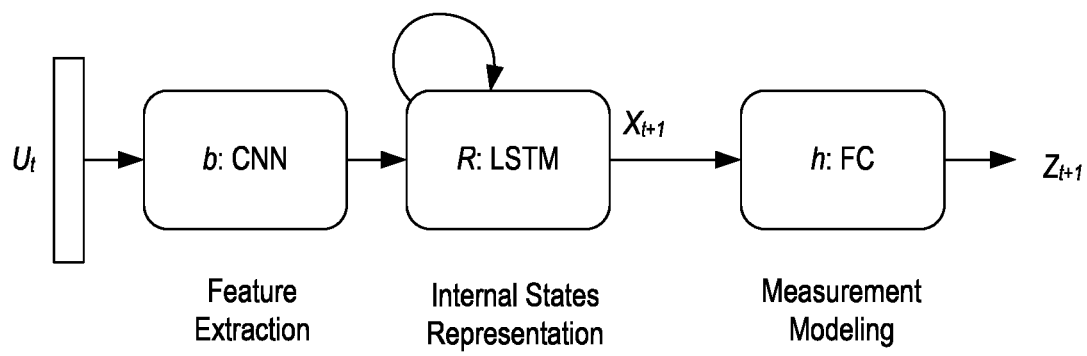
FIG. 11 illustrates an example of a system.

FIG. 11 shows an example of a system 1100 that includes an architecture akin to that of the system 1050 of FIG. 10. As shown in the system 1100, an input vector U can be a time-windowed multiple channels of RPM, BPOS, "in slip", flow rate, number of pipes, etc., while the output can be the response channels of HKLD, SPPA, STOR, etc. In the example system 1100, the transfer function b is provided via a convolution neural network (CNN) that can perform feature extraction that is received by a long short-term memory (LSTM) layer component that can provide for internal states representation, for example, in a latent space (e.g., a feature space). Output of the LSTM component can be received by a fully-connected (FC) layer component, which can provide the measurement function for purposes of measurement modeling. Where LSTM is mentioned, it can be a forget gate (fg) LSTM. Such an LSTM can "forget" certain parameter values as may be appropriate to model temporal behavior of a "plant" (e.g., equipment and environment).

As mentioned, a method can include making comparisons with a pre-defined operational procedure or procedures (e.g., OP or OPs).

As an example, an OP can be defined as a sequence of desired states (e.g., desired internal states) and desired controls as follows:

$$X_S = \{x_0, x_1, \ldots, x_n\}$$

$$U_S = \{u_0, u_1, \ldots, u_{n-1}\}$$

$$OP_S = \{X_S, U_S\}$$

In the foregoing equations, $X_s$ can be obtained by using trained functions b and R per a deep neural network and the input $U_s$ can be a time series defined by the particular OP.

As an example, an actual OP can be defined as a sequence of actual states (e.g., actual internal states) and actual controls as follows:

$$X_i = \{x_0, x_1, \ldots, x_n\}$$

$$U_i = \{u_0, u_1, \ldots, u_{n-1}\}$$

$$OP_i = \{X_i, U_i\}$$

Above, $OP_s$ is the desired operation (e.g., the "target", given through an OP) and $OP_i$ is the i-th observed operation sequence as determined utilizing observations (e.g., measurements) of the dynamic system.

Figure 12:
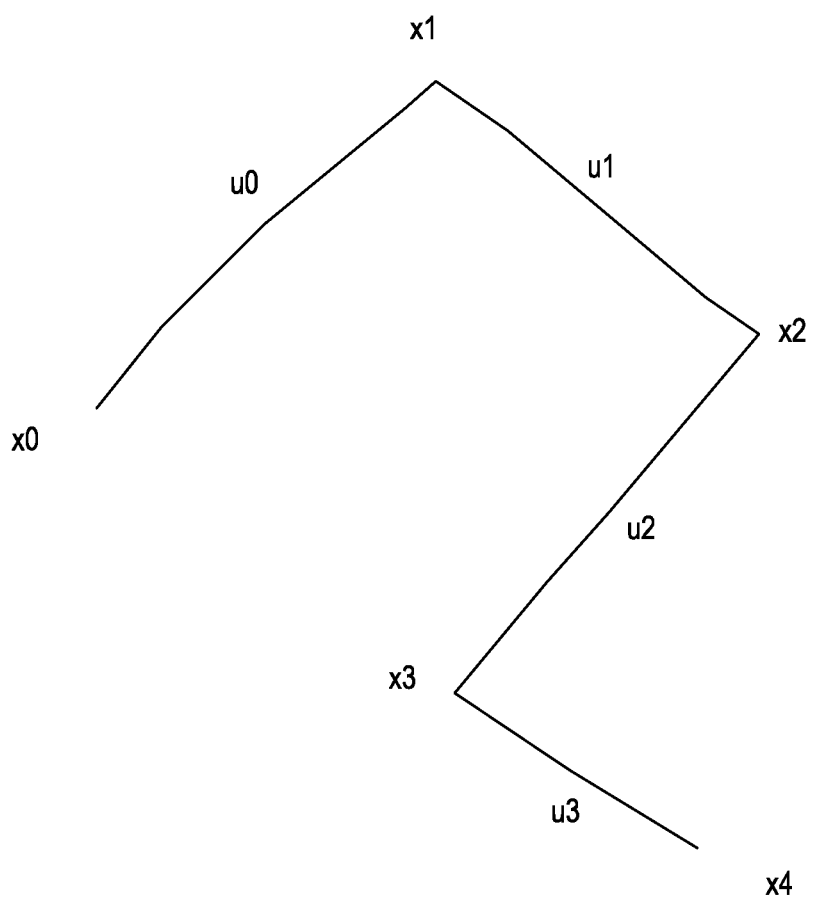
FIG. 12 illustrates an example of a plot.

FIG. 12 shows an example plot 1200 of an OP representation (e.g., $OP_s$) in a latent space 1200 that includes various internal states and controls (e.g., x and u as given above), which can be temporally connected (e.g., temporally related). As shown in FIG. 12, the "legs" can be represented as "u" and the "vertices" between the "legs" can be represented as "x", which form the vectors $U_s$ and $X_s$ and define $OP_s$. As explained above, internal states can be represented as a vector and controls can be represents as a vector where an operational procedure can be a function of an internal state vector (e.g., a vector of internal states) and a control vector (e.g., a vector of controls). As explained, an OP can be for desired internal states and desired controls.

As mentioned, a system can be utilized to make comparisons between desired and actual internal states and/or controls. For example, where an OP is defined with respect to desired internal states and desired controls (e.g., via vectors, etc.), a system can receive as input actual controls (e.g., as a vector) and generate actual internal states (e.g., as a vector) where such information may optionally be compared with an OP or OPs in an appropriate space, which can be a latent space (e.g., a feature space). For example, the plot 1200 can be for an OP that can be rendered to a display in a latent space where a generated actual representation can be overlaid (e.g., simultaneously plotted, etc.) via rendering to the display in the latent space to perform a comparison of the actual well construction operations to pre-defined OP well construction operations. Such a comparison can allow for a temporal comparison of what happened when and in what order during actual well construction where a well construction plan may have been specified to perform various well construction operations according to an OP (e.g., or OPs).

As explained with respect to the system 1100, the internal state vector elements can be obtained by using the trained functions b and R as in a neural network architecture. As an example, an input $U_t$ to the system 1100 can be a time series defined by an OP. In such an approach, an OP can be used to determine corresponding internal states of a dynamic system (e.g., equipment and environment) responsive to well construction operations. Such internal states may be deemed to be desired internal states as those internal states that are desired to be achieved via execution of the time series. Such an approach translates or transforms an OP to internal states. In such an example, an OP can be represented as a number of internal states and corresponding controls, which may be rendered to a display in a latent space (e.g., a feature space as may be associated with the LSTM layer).

Figure 13:
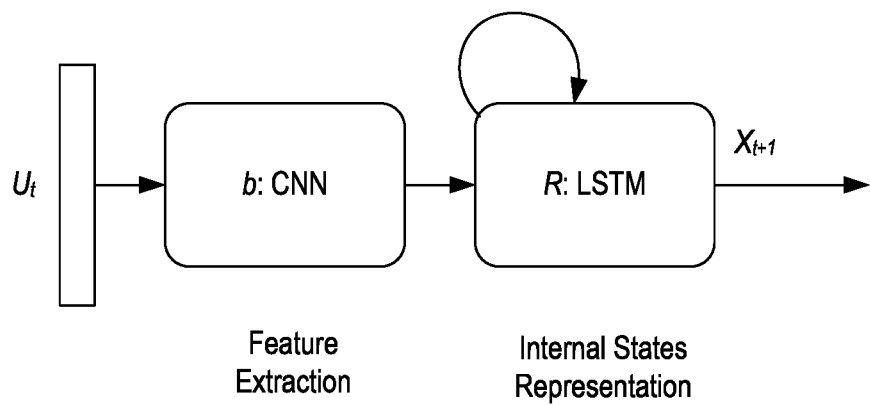
FIG. 13 illustrate an example of a system.

FIG. 13 shows an example of a system 1300, which can be a truncated portion of the system 1100 of FIG. 11 that can be utilized for purposes of simulation of desired internal states (see, e.g., the vector $X_s$) with respect to time. As shown, the input to the system 1300 is a time series of controls (see, e.g., the vector $U_s$), which as a time series is represented as a general input $U_t$. Such input can be subjected to feature extraction using the CNN (see, e.g., transfer function b), which can be provided to an LSTM layer(s), which is recursive and can output values of x with respect to time where the values correspond to internal states that are desired internal states associated with the input time series of controls (e.g., the vector $U_s$). In such a manner, a vector $X_s$ of desired internal states can be generated that is associated with the input time series of controls as the vector $U_s$. The vectors can be utilized to render a representation of an OP to a display in a latent space (e.g., a feature space).

Figure 14:
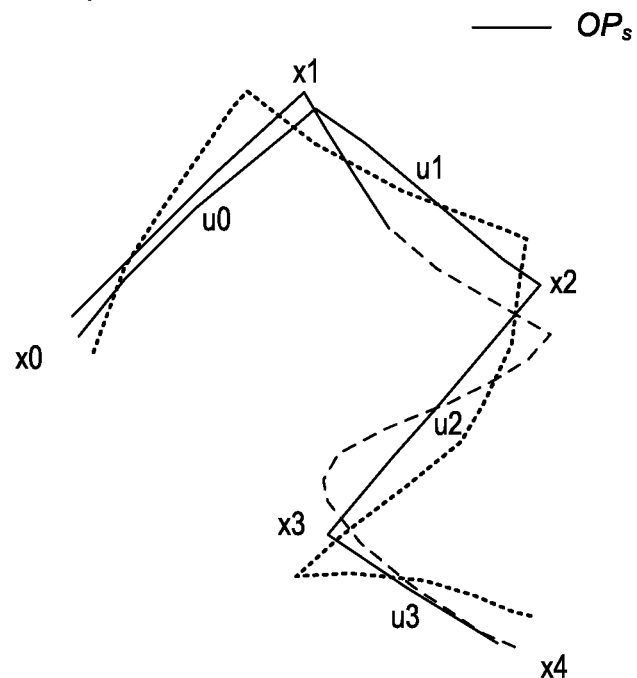
FIG. 14 illustrates an example of a comparison method.

FIG. 14 shows an example of a comparison 1400 where an OP is defined as a temporal sequence and where a score function is utilized to quantify the comparison of the temporal sequence with an actual sequence. As shown in FIG. 14, the "legs" can be represented as "u" and the "vertices" between the "legs" can be represented as "x", which form the vectors $U_s$ and $X_s$ and define $OP_s$ and similarly output for the vectors $U_i$ and $X_i$ that define $OP_i$ can be shown. As an example, more than one set of an $OP_i$ may be shown for purposes of comparison to a set of an $OP_s$.

In the example of FIG. 14, the score function can be defined as follows:

$$S = C(OP_S, OP_i)$$

The foregoing score function can include C, for example, as a distance function, which may determine distance in an appropriate space, which may be a latent space (e.g., a feature space) of a DNN. As mentioned above, $OP_s$ is the desired operation (e.g., the "target", given through an OP) and $OP_i$ is the i-th observed operation sequence as determined utilizing observations (e.g., measurements) of the dynamic system. Accordingly, desired and observed can be compared where such a comparison may be in a latent space (e.g., a feature space) of a DNN. As an example, multi-channel data (e.g., sensor data) from a dynamic system can be utilized as input to a computational framework that includes a trained DNN with a deep Kalman filter to generate output that is indicative of an actual operational action and/or a sequence of operational actions associated with the dynamic system. Such output can be compared to desired output or otherwise processed with respect to desired output to generate a metric or metrics that can quantify compliance with (e.g., adherence to) a desired operational action or actions and its associated response or responses. As an example, the severity of deviation may be represented with a weight vector and integrated into the foregoing equation. As mentioned, a comparison or other assessment may be made in a latent space (e.g., a feature space) or, for example, a space derived therefrom (e.g., using principal component analysis (PCA), etc., which may reduce dimensionality for one or more purposes).

The approach of FIG. 14 can be utilized to answer the question: "How accurately is an OP followed?" Such an approach can provide for operation-level comparison of desired and actual, which may be utilized for adjusting a well construction plan, controlling one or more well construction operations, etc.

As an example, the following question may be asked: "Where did operations deviate from an OP?" Such a question can be for an activity-level comparison. For example, consider a method that divides an OP into several segments by activity labels (e.g., as may be specified by an OP). Such a method can include mapping operation i onto an OP segments (e.g., nearest neighbor) and comparing the m-th operation in the OP with the n-th actual operation. Such an approach may utilize an equation such as the following equation:

$$S_{m,n} = C(OP_{s,m}, OP_{i,n})$$

As explained above, a method can include representing well construction operations (e.g., processes with respect to a dynamic system) with respect to a Kalman filter where a "plant" (e.g., equipment and environment) can be represented as internal states, which can be generated using a neural network architecture that includes feature extraction (e.g., via a CNN) fed into one or more long short-term memory (LSTM) layers that can adequately account for temporal aspects of operations with respect to the "plant". The use of the Kalman filter allows for association of controls and internal states, which can be relevant to one or more pre-defined operational procedures (OPs). As explained, an OP can specify operations as controls where corresponding internal states can be generated via a trained neural network (e.g., CNN/LSTM). Those controls and internal states can be deemed "desired" and can be compared to actual to determine whether and/or to what extent actual operations complied with one or more specified OPs.

The foregoing approach involves representations of problems and tasks. As explained, the Kalman filter approach allows for separation of control and response signals. As explained, a system can provide a more precise definition of an internal state X. A system can be utilized in a method that is data driven, for example, where training occurs for a neural network computational framework using offset well data. As explained, temporal attributes can be addressed using filters trained with a time series feature extraction CNN (see, e.g., the component for the transfer function b in the Kalman filter representation).

As mentioned, a method can include using a non-linear Kalman filter to describe the dynamics of a rig drilling system and using a deep neural network to represent the functions in the Kalman filter. A method can include training such a deep neural network with actual drilling dataset (e.g., offset wells, etc.). As mentioned, a method can include representing an OP with simulated control sequence, activity labels, and corresponding internal states by a trained deep neural network. In such an approach, the OP can be quantified, where the quantification can utilize encoded, compressed internal states as generated by one or more LSTM layers. A method can include representing actual operation with internal states generated by the trained deep neural network (e.g., via input of actual operational information to the trained deep neural network). As explained, an operation-level comparison can include using a comparison function C to evaluate an OP versus actual operation. As an example, a method can include classifying actual operation internal states by the activity labels from an OP. As an example, a method can include performing an activity-level comparison using a comparison function C to evaluate an activity in an OP versus the corresponding activity in an actual operation sequence.

Figure 15:
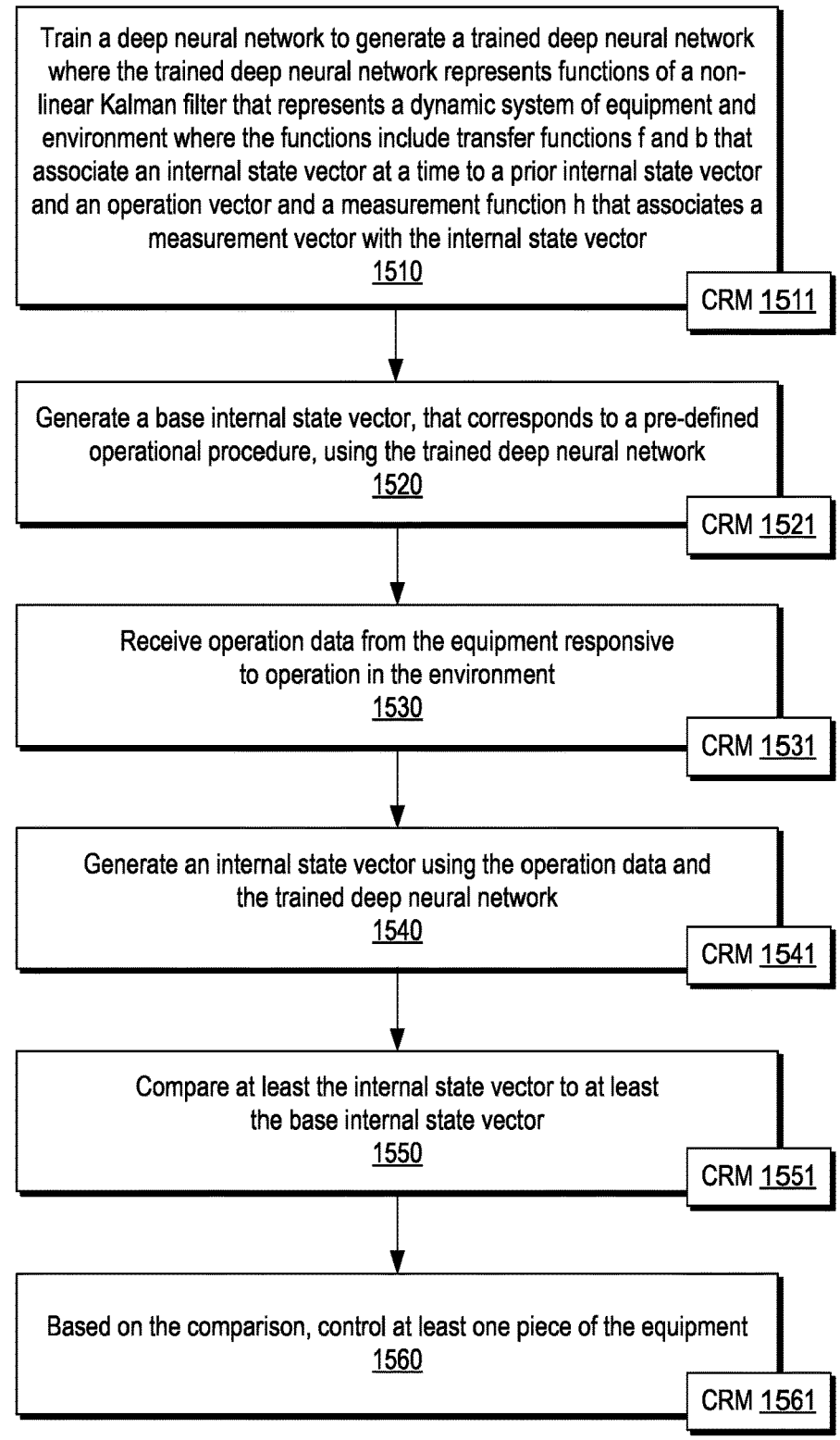
FIG. 15 illustrates an example of a method.

FIG. 15 shows an example of a method 1500 that includes a train block 1510 for training a deep neural network to generate a trained deep neural network where the trained deep neural network represents functions of a non-linear Kalman filter that represents a dynamic system of equipment and environment where the functions include transfer functions f and b that associate an internal state vector at a time to a prior internal state vector and an operation vector and a measurement function h that associates a measurement vector with the internal state vector; a generation block 1520 for generating a base internal state vector, that corresponds to a pre-defined operational procedure, using the trained deep neural network; a reception block 1530 for receiving operation data from the equipment responsive to operation in the environment; a generation block 1540 for generating an internal state vector using the operation data and the trained deep neural network; a comparison block 1550 for comparing at least the internal state vector to at least the base internal state vector; and a control block 1560 for, based on the comparing, controlling at least one piece of the equipment.

FIG. 15 also shows various computer-readable media (CRM) blocks 1511, 1521, 1531, 1541, 1551 and 1561 as associated with the blocks 1510, 1520, 1530, 1540, 1550 and 1560. Such blocks can include instructions that are executable by one or more processors, which can be one or more processors of a computational framework, a system, a computer, etc. A computer-readable medium can be a computer-readable storage medium that is not a signal, not a carrier wave and that is non-transitory. For example, a computer-readable medium can be a physical memory component that can store information in a digital format.

Figure 16:
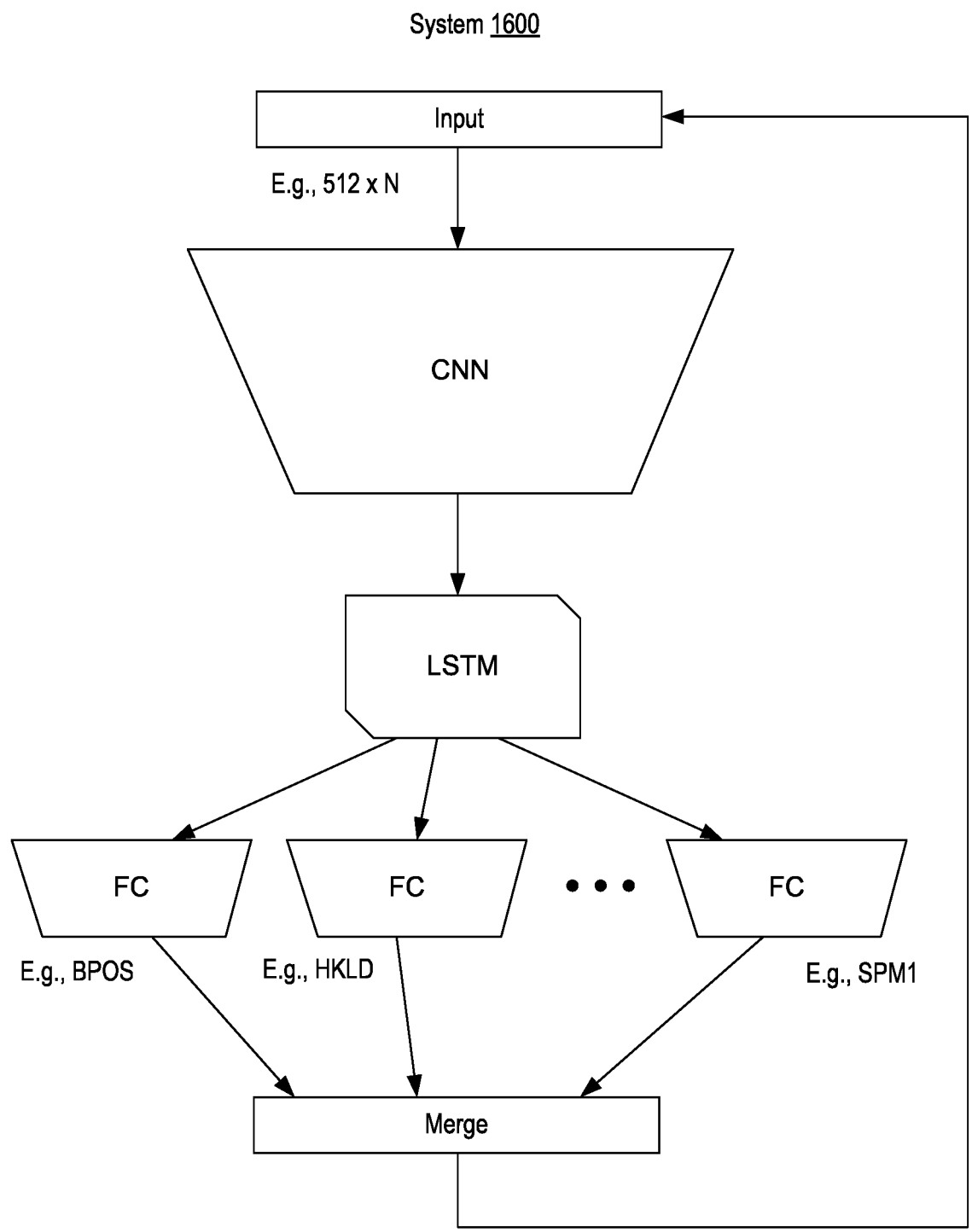
FIG. 16 illustrates an example of a system.

FIG. 16 shows an example of a system 1600 that includes various structures including an input component, a CNN, LSTMs, CFs and a merge component. Examples of types of data are illustrated with respect to the CFs, including BPOS, HKLD, SPM1 (e.g., stroke per minute as may be representative of a pump rate, etc.), etc.

Figure 17:
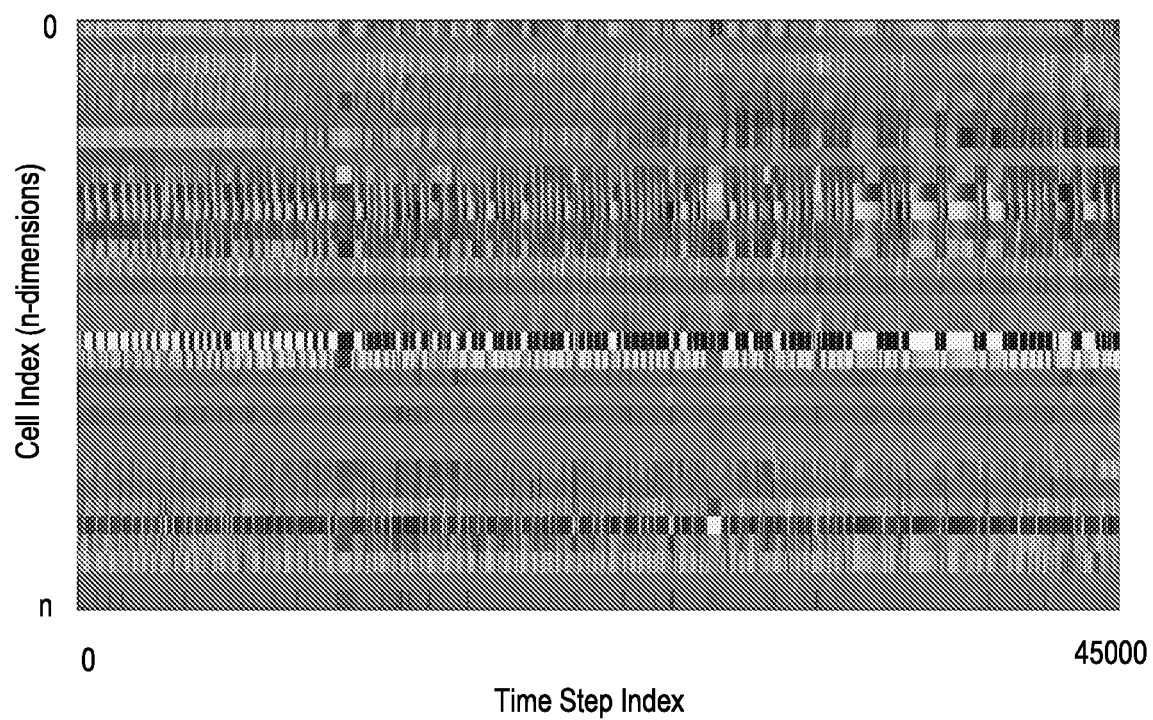
FIG. 17 illustrates an example of an encoded time sequence.

FIG. 17 shows an encoded time sequence in a latent space of the system 1600 of FIG. 16, which is configured to implement a non-linear Kalman filter model. The system 1600 can model the transfer functions of the filter using such a deep neural network architecture. The transfer functions can be solved by training the system 1600 to generate a trained system where such training can utilize actual training data (e.g., time series data). As mentioned with respect to FIG. 16, the system 1600 includes a deep neural network model with components of convolutional neural network layers (CNN), long short-term memory layers (LSTM), and fully-connected layers (FC).

Figure 18:
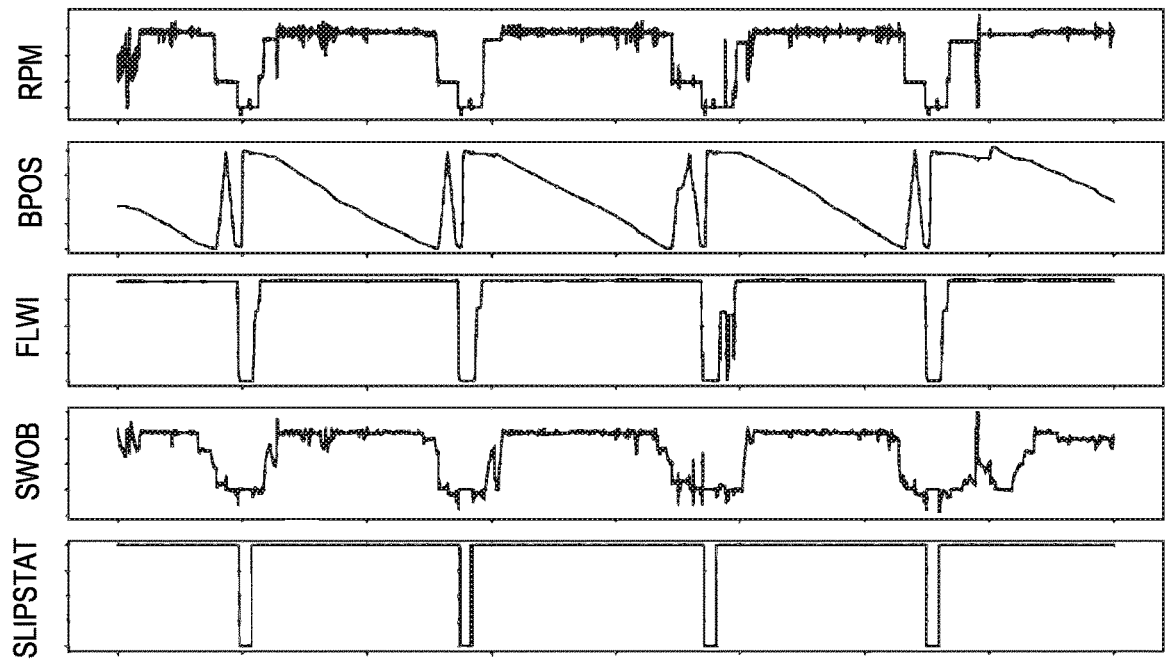
FIG. 18 illustrates examples of plots of training data.
Figure 18:
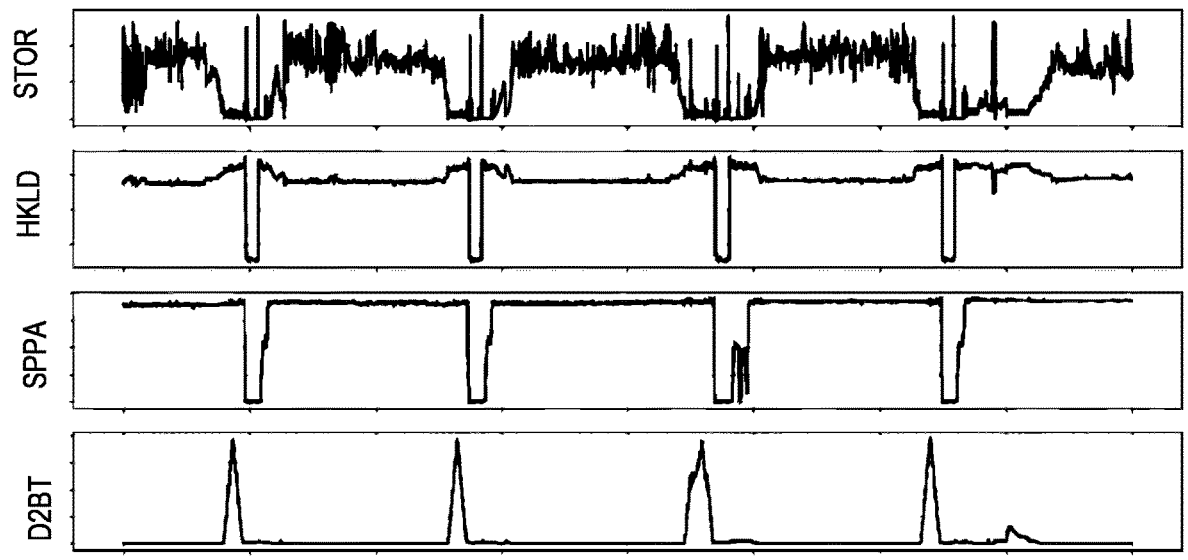
Figure 19:
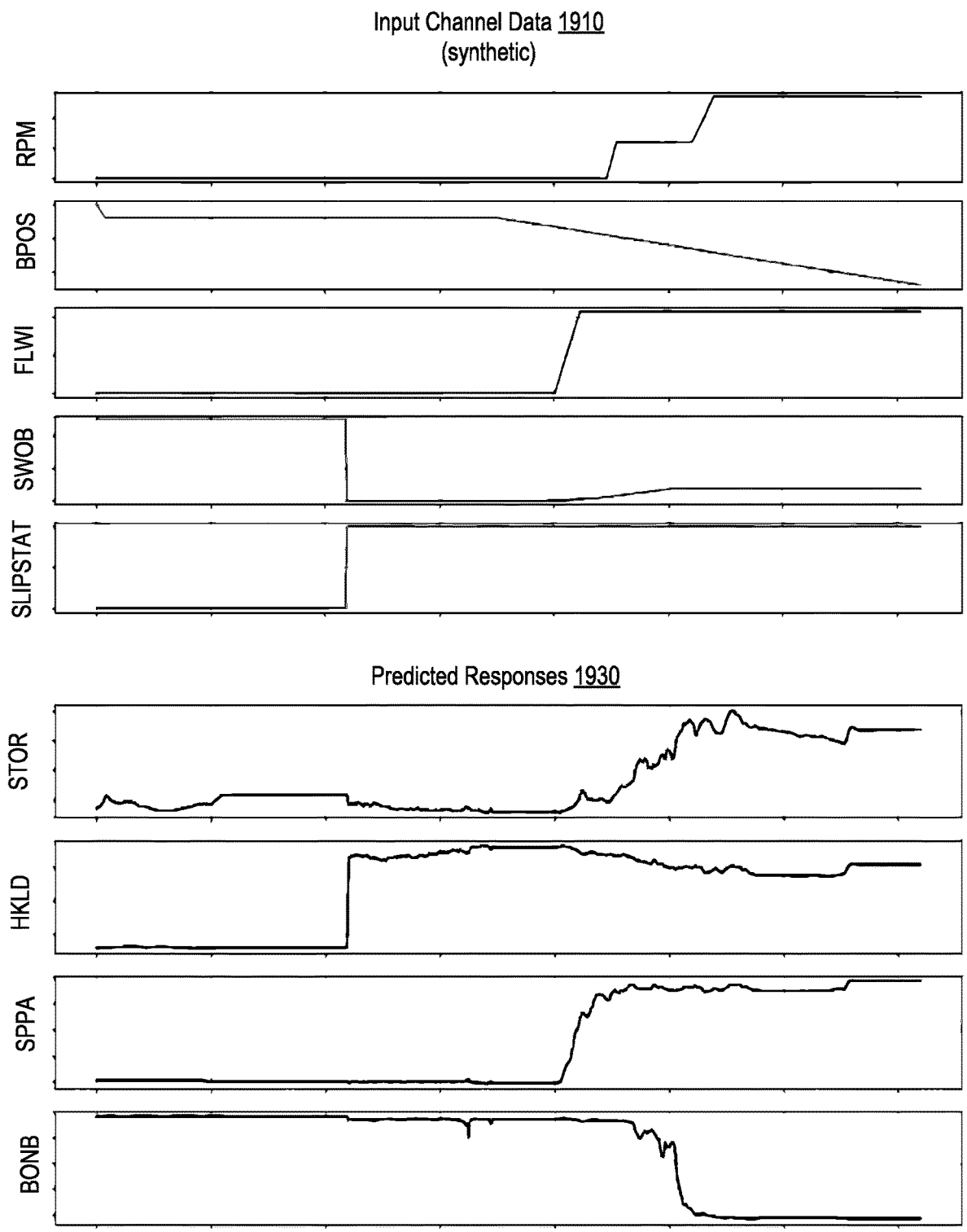
FIG. 19 illustrates an example of a plot of input and an example of a plot of predicted responses.

FIGS. 18 and 19 show plots of training data 1810 and 1830, a plot of input data 1910 (e.g., synthetic) and a plot of output data 1930. The system 1600 was trained using over 160,000 records of real drilling data to generate a trained system. Specifically, the functions b, R, and h become available through training. As an example, the input vector U can be time-windowed, multiple channels of RPM, block position, slip status, flow rate, weight on bit while the output can be the response channels of torque (STOR), rate of penetration (ROP), hookload, pressure, etc. An accuracy as to output was achieved of approximately 99.5 percent after 50 epochs. FIG. 19 shows the predicted response (the plot 1930) from synthetic channels (the plot 1910).

Figure 20:
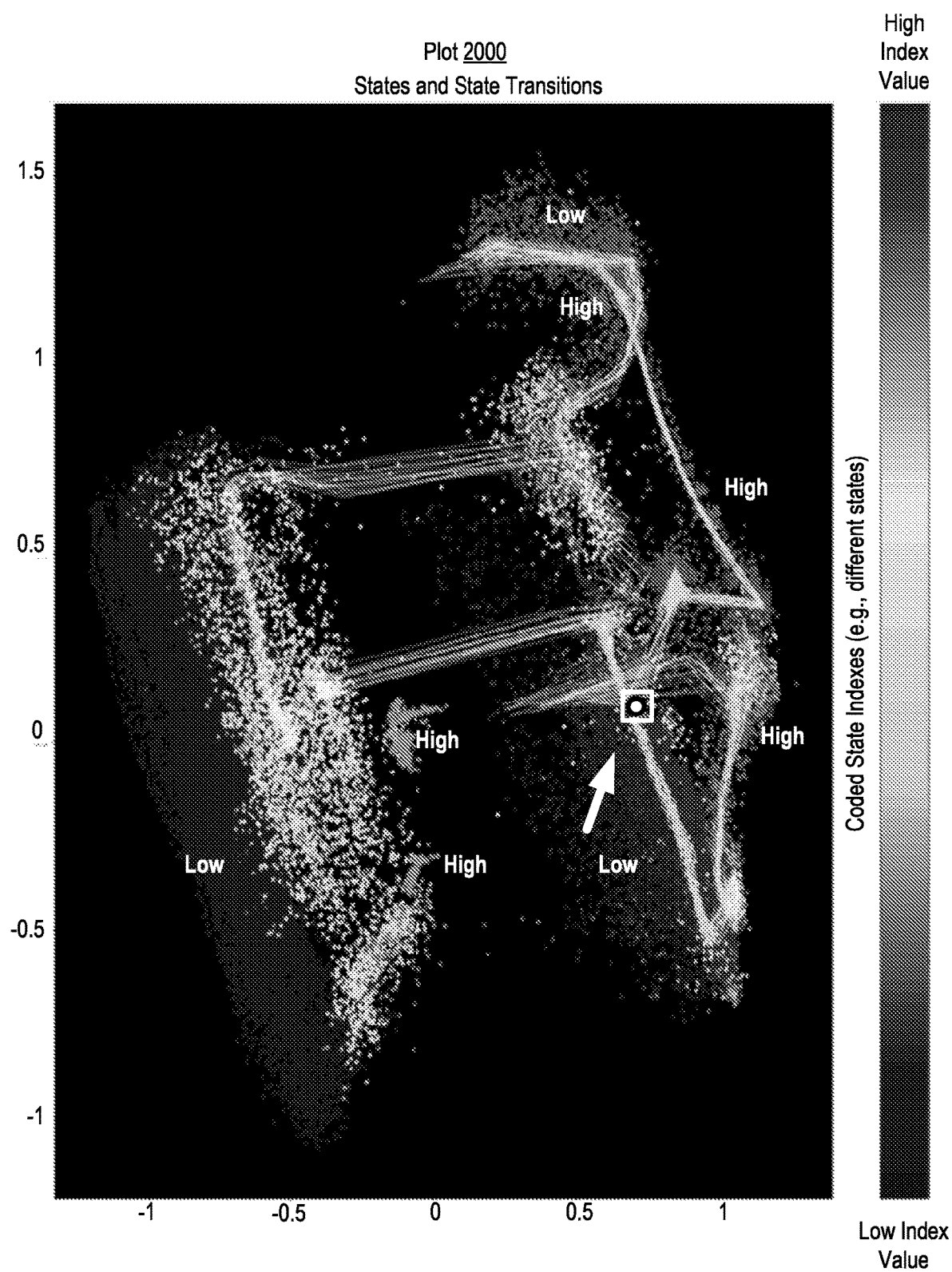
FIG. 20 illustrates a plot of a processed state space.

FIG. 20 shows output in a processed space 2000 as generated from LSTM output in a latent space. FIG. 20 demonstrates the dynamics of a simulated time series in the latent space. To visualize the dynamics of drilling states, a principal component analysis (PCA) transform was applied to reduce the dimension and then the training dataset rendered as the dots in the space, and coded by a rig state processor (e.g., using a numerical index from a low index value to a high index value where each value represents a different state), which interprets the drilling time series into different rig states such as, for example, in and out of slips, on/off bottom, etc.

In the example of FIG. 20, the white lines show the dynamics of the simulated states. The simulation started at the white circle in the middle-right and ends at the white box, which is at approximately the same location. The loops of the white lines correspond to multiple stands drilled. The drilling states path is repeated, but with certain variations in each stand.

Specifically, FIG. 20 shows a visualization of dynamics of simulation in latent space as output by a simulator. The data are from the last recurrent layer output, which is projected onto the first two PCA dimensions, which represents the latent space of encoding. Points are coded by rig state, which are numbered from low state index to high state index. The white line overlain on the point projection shows the dynamics of simulation. As mentioned, the dynamic simulation started at the location as indicated by the white circle and ended at the location of white box.

As explained, a deep neural network model can be utilized for generating simulated autonomous time series data with control signals as input. FIG. 16 shows an example of a system 1600 that can be trained using training data such as the data of the plots 1710 and 1730 to generate a trained system. Such a trained system can receive control signals as input such as in the plot 1810 and can generate time series data such as in the plot 1830. As explained, a trained system can generate encoded time series output that can be represented in a latent space, which may be processed for one or more purposes (e.g., visualization, etc.).

As an example, a computational framework can include one or more machine learning models for field operations. Such a framework can be utilized for control of one or more field operations. For example, consider a computational framework that is operatively coupled to one or more pieces of field equipment for control of one or more drilling operations.

As an example, a field controller can be calibrated using data generated by one or more machine learning models of a computational framework. Such data may be referred to as synthetic data that represents actual field operations. As an example, such data may be drilling time series data. A computational framework that generates such synthetic data can be referred to as a computational simulator, which is a type of device or system, which may be consolidated or distributed. For example, a computational simulator can be a device or a system that includes one or more processors and memory where circuitry thereof is specialized (e.g., via configuration by processor-executable instructions stored in the memory) to generate synthetic data that represents actual field operations. As an example, a method can utilize synthetic data for one or more purposes such as, for example, calibration of a field controller to generate a calibrated field controller (e.g., via tuning, etc.), testing of a field controller, etc. As an example, a computational framework that can generate synthetic data representative of one or more field operations can be utilized to infer one or more states of a one or more drilling operations, optionally in real time. For example, channels of real time drilling operation data can be received and characterized using generated synthetic data, which may be generated based at least in part on one or more operational parameters associated with the real time drilling operation.

Figure 21:
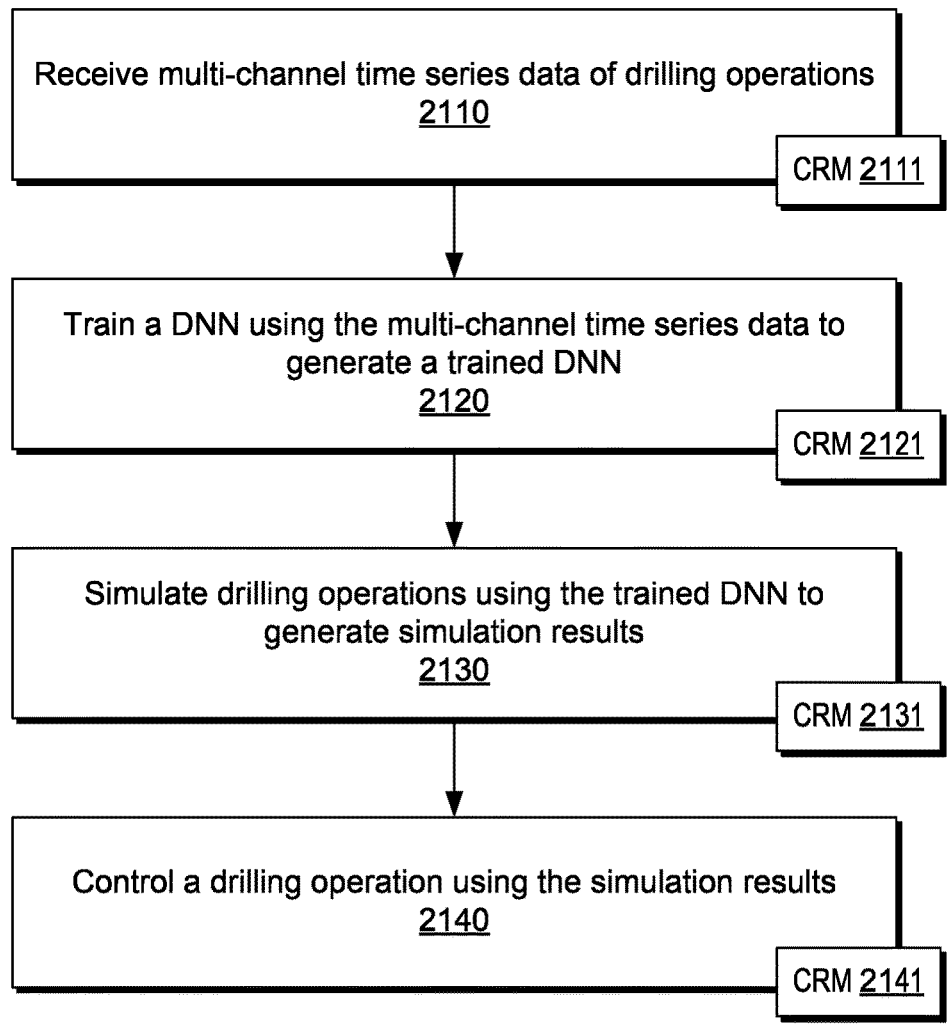
FIG. 21 illustrates an example of a method and an example of a system.
Figure 21:
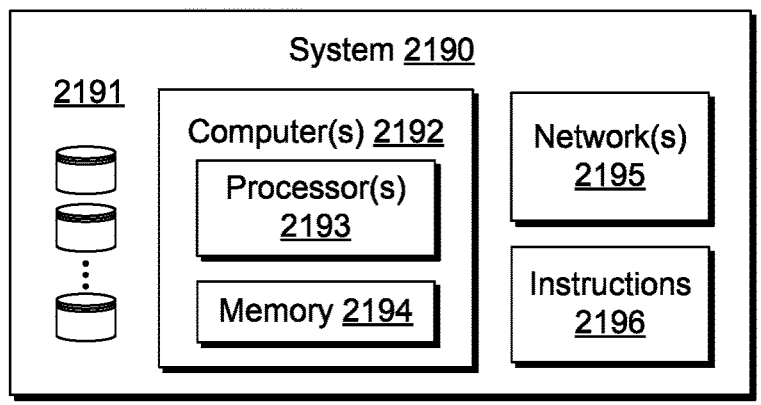

FIG. 21 shows an example of a method 2100 that includes a reception block 2110 for receiving multi-channel time series data of drilling operations; a train block 2120 for training a deep neural network (DNN) using the multi-channel time series data to generate a trained deep neural network where the deep neural network includes at least one recurrent unit (e.g., consider a forget gate long short term memory unit, etc.); a simulation block 2130 for simulating drilling operations using the trained deep neural network to generate simulation results; and a control block 2140 for controlling a drilling operation using the simulation results. As an example, the foregoing method can include generating the trained deep neural network as part of a computational simulator where the computational simulator can be utilized for simulating drilling operations.

FIG. 21 also shows various computer-readable media (CRM) blocks 2111, 2121, 2131 and 2141 as associated with the blocks 2110, 2120, 2130 and 2140. Such blocks can include instructions that are executable by one or more processors, which can be one or more processors of a computational framework, a system, a computer, etc. A computer-readable medium can be a computer-readable storage medium that is not a signal, not a carrier wave and that is non-transitory. For example, a computer-readable medium can be a physical memory component that can store information in a digital format.

In the example of FIG. 21, a system 2190 includes one or more information storage devices 2191, one or more computers 2192, one or more networks 2195 and instructions 2196. As to the one or more computers 2192, each computer may include one or more processors (e.g., or processing cores) 2193 and memory 2194 for storing the instructions 2196, for example, executable by at least one of the one or more processors. As an example, a computer may include one or more network interfaces (e.g., wired or wireless), one or more graphics cards, a display interface (e.g., wired or wireless), etc. As an example, the system 2190 can be a computational simulator.

As an example, a method can include training a deep neural network to generate a trained deep neural network where the trained deep neural network represents functions of a non-linear Kalman filter that represents a dynamic system of equipment and environment via an internal state vector of the dynamic system; generating a base internal state vector, that corresponds to a pre-defined operational procedure, using the trained deep neural network; receiving operation data from the equipment responsive to operation in the environment; generating an internal state vector using the operation data and the trained deep neural network; and comparing at least the internal state vector to at least the base internal state vector. As an example, such a method can include controlling at least one piece of the equipment, which can be based on the comparing. As an example, a method can include rendering a graphical representation of an internal state vector and/or a base internal state vector to a display. For example, consider a method where rendering is performed responsive to generating the internal state vector using operation data.

As an example, a method can include using functions that include transfer functions that associate an internal state vector at a time to a prior internal state vector and an operation vector and where the functions include a measurement function that associates a measurement vector with the internal state vector.

As an example, a deep neural network can include a convolution neural network layer and a long short-term memory layer, which can be include a forget gate (e.g., a fgLSTM).

As an example, a method can include comparing at least an internal state vector to at least a base internal state vector in a latent space, which can be a space associated with a recurrent unit in a neural network architecture (e.g., consider a LSTM as a recurrent unit).

As an example, a pre-defined operational procedure can include a series of proscribed actions. In such an example, the proscribed actions can be performed using one or more pieces of equipment that can be part of a dynamic system.

As an example, a method can include comparing at least an internal state vector to at least a base internal state vector by utilizing a score function.

As an example, internal states of an internal state vector can be represented as points in a state space. For example, a distance between two sequential points in a state space can represent a temporal process of a dynamic system that transitions the dynamic system from a first one of the points to the second one of the points (see, e.g., the plot 2000 of FIG. 20). In such an example, a method can include comparing a temporal process to a process of a pre-defined operational procedure.

As an example, equipment can include well construction equipment and/or an environment can include a formation in the Earth (e.g., a subterranean geological formation). As an example, well construction can be on-shore, off-shore or a combination of on-shore and off-shore.

As an example, a method can include training a deep neural network where the deep neural network is trained using time series data. As an example, a deep neural network can be trained using multi-channel time series data.

As an example, a system can include a processor; memory accessible by the processor; processor-executable instructions stored in the memory and executable to instruct the system to: train a deep neural network to generate a trained deep neural network where the trained deep neural network represents functions of a non-linear Kalman filter that represents a dynamic system of equipment and environment via an internal state vector of the dynamic system; generate a base internal state vector, that corresponds to a pre-defined operational procedure, using the trained deep neural network; receive operation data from the equipment responsive to operation in the environment; generate an internal state vector using the operation data and the trained deep neural network; and compare at least the internal state vector to at least the base internal state vector. In such an example, the processor-executable instructions can include instructions to instruct the system to control at least one piece of the equipment, for example, based on the comparison (e.g., or comparisons, etc.).

As an example, one or more computer-readable storage media can include processor-executable instructions to instruct a computing system to: train a deep neural network to generate a trained deep neural network where the trained deep neural network represents functions of a non-linear Kalman filter that represents a dynamic system of equipment and environment via an internal state vector of the dynamic system; generate a base internal state vector, that corresponds to a pre-defined operational procedure, using the trained deep neural network; receive operation data from the equipment responsive to operation in the environment; generate an internal state vector using the operation data and the trained deep neural network; and compare at least the internal state vector to at least the base internal state vector. In such an example, the one or more computer-readable storage media can include processor-executable instructions to instruct the computing system to control at least one piece of the equipment, for example, based on the comparison (e.g., or comparisons, etc.).

As an example, a method may be implemented in part using computer-readable media (CRM), for example, as a module, a block, etc. that include information such as instructions suitable for execution by one or more processors (or processor cores) to instruct a computing device or system to perform one or more actions. As an example, a single medium may be configured with instructions to allow for, at least in part, performance of various actions of a method. As an example, a computer-readable medium (CRM) may be a computer-readable storage medium (e.g., a non-transitory medium) that is not a carrier wave.

According to an embodiment, one or more computer-readable media may include computer-executable instructions to instruct a computing system to output information for controlling a process. For example, such instructions may provide for output to sensing process, an injection process, drilling process, an extraction process, an extrusion process, a pumping process, a heating process, etc.

Figure 22:
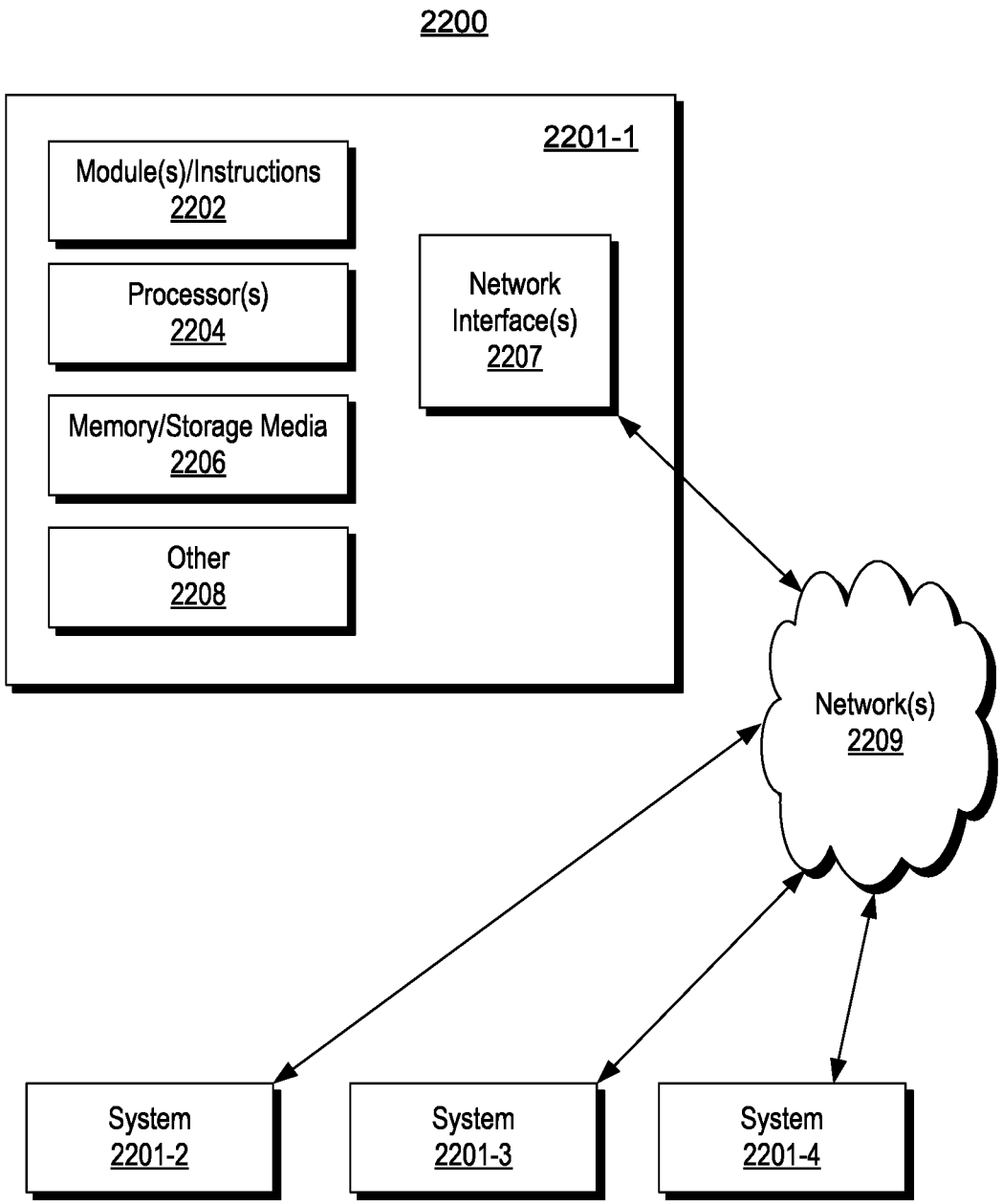
FIG. 22 illustrates an example of computing system.

In some embodiments, a method or methods may be executed by a computing system. FIG. 22 shows an example of a system 2200 that can include one or more computing systems 2201-1, 2201-2, 2201-3 and 2201-4, which may be operatively coupled via one or more networks 2209, which may include wired and/or wireless networks.

As an example, a system can include an individual computer system or an arrangement of distributed computer systems. In the example of FIG. 22, the computer system 2201-1 can include one or more modules 2202, which may be or include processor-executable instructions, for example, executable to perform various tasks (e.g., receiving information, requesting information, processing information, simulation, outputting information, etc.).

As an example, a module may be executed independently, or in coordination with, one or more processors 2204, which is (or are) operatively coupled to one or more storage media 2206 (e.g., via wire, wirelessly, etc.). As an example, one or more of the one or more processors 2204 can be operatively coupled to at least one of one or more network interface 2207. In such an example, the computer system 2201-1 can transmit and/or receive information, for example, via the one or more networks 2209 (e.g., consider one or more of the Internet, a private network, a cellular network, a satellite network, etc.).

As an example, the computer system 2201-1 may receive from and/or transmit information to one or more other devices, which may be or include, for example, one or more of the computer systems 2201-2, etc. A device may be located in a physical location that differs from that of the computer system 2201-1. As an example, a location may be, for example, a processing facility location, a data center location (e.g., server farm, etc.), a rig location, a wellsite location, a downhole location, etc.

As an example, a processor may be or include a microprocessor, microcontroller, processor module or subsystem, programmable integrated circuit, programmable gate array, or another control or computing device.

As an example, the storage media 2206 may be implemented as one or more computer-readable or machine-readable storage media. As an example, storage may be distributed within and/or across multiple internal and/or external enclosures of a computing system and/or additional computing systems.

As an example, a storage medium or storage media may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUERAY® disks, or other types of optical storage, or other types of storage devices.

As an example, a storage medium or media may be located in a machine running machine-readable instructions, or located at a remote site from which machine-readable instructions may be downloaded over a network for execution.

As an example, various components of a system such as, for example, a computer system, may be implemented in hardware, software, or a combination of both hardware and software (e.g., including firmware), including one or more signal processing and/or application specific integrated circuits.

As an example, a system may include a processing apparatus that may be or include a general purpose processors or application specific chips (e.g., or chipsets), such as ASICs, FPGAs, PLDs, or other appropriate devices.

Figure 23:
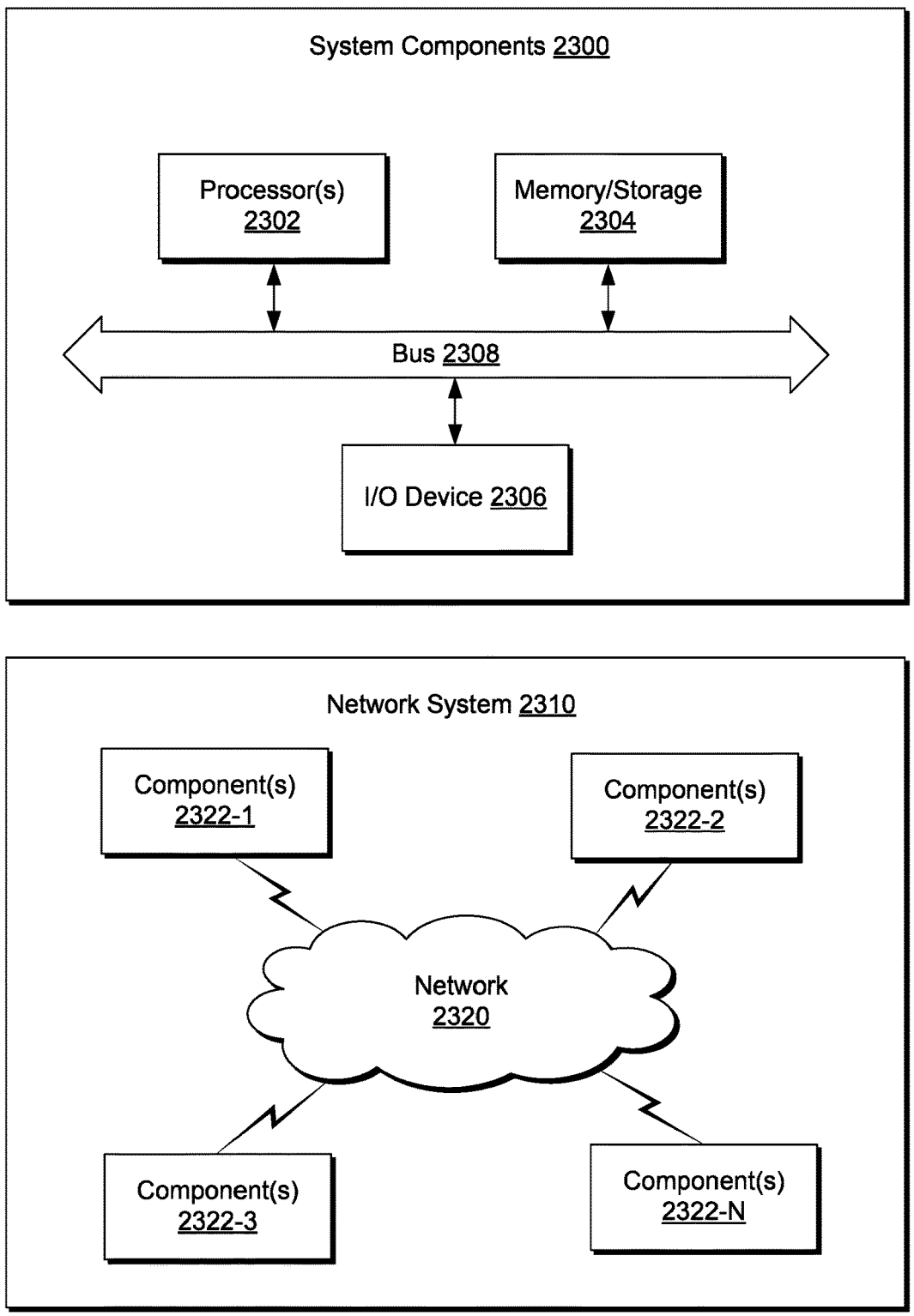
FIG. 23 illustrates example components of a system and a networked system.

FIG. 23 shows components of a computing system 2300 and a networked system 2310. The system 2300 includes one or more processors 2302, memory and/or storage components 2304, one or more input and/or output devices 2306 and a bus 2308. According to an embodiment, instructions may be stored in one or more computer-readable media (e.g., memory/storage components 2304). Such instructions may be read by one or more processors (e.g., the processor(s) 2302) via a communication bus (e.g., the bus 2308), which may be wired or wireless. The one or more processors may execute such instructions to implement (wholly or in part) one or more attributes (e.g., as part of a method). A user may view output from and interact with a process via an I/O device (e.g., the device 2306). According to an embodiment, a computer-readable medium may be a storage component such as a physical memory storage device, for example, a chip, a chip on a package, a memory card, etc.

According to an embodiment, components may be distributed, such as in the network system 2310. The network system 2310 includes components 2322-1, 2322-2, 2322-3, . . . 2322-N. For example, the components 2322-1 may include the processor(s) 2302 while the component(s) 2322-3 may include memory accessible by the processor(s) 2302. Further, the component(s) 2322-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few examples have been described in detail above, those skilled in the art will readily appreciate that many modifications are possible in the examples. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method comprising:
   accessing a trained deep neural network wherein the trained deep neural network represents functions of a non-linear Kalman filter that represents a dynamic system of equipment and environment via an internal state vector of the dynamic system, wherein the deep neural network comprises a convolution neural network layer that represents a first one of the functions and a long short-term memory layer that represents second one of the functions;
   generating a base internal state vector in a latent space, that corresponds to a pre-defined operational procedure, using the trained deep neural network;
   receiving operation data from the equipment responsive to controlled operation in the environment by a controller;
   generating an internal state vector in the latent space using the operation data and the trained deep neural network;
   comparing at least the internal state vector to at least the base internal state vector; and
   based on the comparing, calibrating the controller for additional controlled operation in the environment.

2. The method of claim 1 further comprising, based on the comparing, controlling at least one piece of the equipment.

3. The method of claim 1 further comprising rendering a graphical representation of the internal state vector and the base internal state vector to a display.

4. The method of claim 3 wherein the rendering is performed responsive to generating the internal state vector using the operation data.

5. The method of claim 1 wherein the functions comprise transfer functions that associate the internal state vector at a time to a prior internal state vector and an operation vector and wherein the functions comprise a measurement function that associates a measurement vector with the internal state vector.

6. The method of claim 1 wherein the comparing at least the internal state vector to at least the base internal state vector comprises comparing in the latent space.

7. The method of claim 1 wherein the pre-defined operational procedure comprises a series of proscribed actions.

8. The method of claim 1 wherein the comparing at least the internal state vector to at least the base internal state vector comprises utilizing a score function.

9. The method of claim 1 wherein internal states of the internal state vector are represented as points in a state space.

10. The method of claim 9 wherein a distance between two sequential points in the state space represents a temporal process of the dynamic system that transitions the dynamic system from a first one of the points to the second one of the points.

11. The method of claim 10 comprising comparing the temporal process to a process of the pre-defined operational procedure.

12. The method of claim 1 wherein the equipment comprises well construction equipment.

13. The method of claim 1 wherein the environment comprises a formation in the Earth.

14. The method of claim 1 wherein the deep neural network is trained using time series data.

15. The method of claim 1 wherein the deep neural network is trained using multi-channel time series data.

16. A system comprising:
a processor;
memory accessible by the processor;
processor-executable instructions stored in the memory and executable to instruct the system to:
 access a trained deep neural network wherein the trained deep neural network represents functions of a non-linear Kalman filter that represents a dynamic system of equipment and environment via an internal state vector of the dynamic system, wherein the deep neural network comprises a convolution neural network layer that represents a first one of the functions and a long short-term memory layer that represents second one of the functions;
 generate a base internal state vector in a latent space, that corresponds to a pre-defined operational procedure, using the trained deep neural network;
 receive operation data from the equipment responsive to controlled operation in the environment by a controller;
 generate an internal state vector in the latent space using the operation data and the trained deep neural network;
 perform a comparison at least the internal state vector to at least the base internal state vector; and
 based on the comparison, calibrate the controller for additional controlled operation in the environment.

17. The system of claim 16 wherein the processor-executable instructions comprise instructions to, based on the comparison, instruct the system to control at least one piece of the equipment.

18. One or more non-transitory computer-readable storage media comprising processor-executable instructions to instruct a computing system to:
access a trained deep neural network wherein the trained deep neural network represents functions of a non-linear Kalman filter that represents a dynamic system of equipment and environment via an internal state vector of the dynamic system, wherein the deep neural network comprises a convolution neural network layer that represents a first one of the functions and a long short-term memory layer that represents second one of the functions;
generate a base internal state vector in a latent space, that corresponds to a pre-defined operational procedure, using the trained deep neural network;
receive operation data from the equipment responsive to controlled operation in the environment by a controller;
generate an internal state vector in the latent space using the operation data and the trained deep neural network;
perform a comparison at least the internal state vector to at least the base internal state vector; and
based on the comparison, calibrate the controller for additional controlled operation in the environment.

19. The one or more non-transitory computer-readable storage media of claim 18 wherein the processor-executable instructions comprise instructions to, based on the comparison, instruct the computing system to control at least one piece of the equipment.

* * * * *